US008356913B2

(12) United States Patent
Nagai

(10) Patent No.: US 8,356,913 B2
(45) Date of Patent: *Jan. 22, 2013

(54) LIGHT-EMITTING APPARATUS

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/327,255

(22) Filed: Dec. 15, 2011

(65) Prior Publication Data

US 2012/0087123 A1    Apr. 12, 2012

Related U.S. Application Data

(63) Continuation of application No. 12/445,013, filed as application No. PCT/JP2007/070306 on Oct. 11, 2007, now Pat. No. 8,104,923.

(30) Foreign Application Priority Data

Oct. 12, 2006   (JP) .................................. 2006-279102
Feb. 20, 2007   (JP) .................................. 2007-039855

(51) Int. Cl.
*F21V 1/00*     (2006.01)
*F21V 11/00*    (2006.01)

(52) U.S. Cl. ........ 362/240; 362/245; 362/297; 362/310; 362/329

(58) Field of Classification Search ............. 362/296.01, 362/297, 266.05, 310, 307, 308, 327, 329, 362/240, 241, 245, 84, 11, 13, 16, 26–30, 362/603, 609, 611–614, 616, 632–634, 475, 362/457, 507, 520, 643, 546, 549, 97.1–97.4, 362/121, 125, 184, 185, 189, 217.05, 217.07, 362/249.02, 249.06, 249.11, 249.14–249.17, 362/311.02, 311.09, 296.07
See application file for complete search history.

(56) References Cited

U.S. PATENT DOCUMENTS

| 5,136,483 | A | 8/1992 | Schoniger et al. |
| 5,169,230 | A * | 12/1992 | Palmer .......................... 362/350 |
| 5,444,520 | A | 8/1995 | Murano |
| 6,650,044 | B1 | 11/2003 | Lowery |
| 7,229,198 | B2 * | 6/2007 | Sakai et al. .................... 362/560 |
| 7,237,927 | B2 | 7/2007 | Coushaine et al. |

(Continued)

FOREIGN PATENT DOCUMENTS

EP           1 276 157        1/2003
(Continued)

*Primary Examiner* — Danielle Allen
(74) *Attorney, Agent, or Firm* — Hamre, Schumann, Mueller & Larson, P.C.

(57) ABSTRACT

The light-emitting apparatus (1) of the present invention includes: a storage case (12) that includes a base board (10) having a concave portion (10a) and a lid portion (11) covering the concave portion (10a); and a plurality of light-emitting elements (13) that are disposed on an inner surface (12a) of the storage case (12), an opening (11a) is formed in the lid portion (11), at least a part of the inner surface (12a) is a light-reflecting surface that wave-guides light emitted by the light-emitting elements (13) as light sources to a position directly underneath the opening (11), and a reflecting portion (15) that reflects the light emitted by the light-emitting elements (13) as the light sources toward the opening (11a) is formed directly underneath the opening (11a). Thereby, the light-emitting apparatus having a point light source with high brightness can be provided.

12 Claims, 16 Drawing Sheets

U.S. PATENT DOCUMENTS

| | | | |
|---|---|---|---|
| 7,350,951 B2 * | 4/2008 | Sakai et al. | 362/555 |
| 2002/0030996 A1 | 3/2002 | Sakakibara | |
| 2002/0030998 A1 | 3/2002 | Natsume | |
| 2002/0105807 A1 | 8/2002 | Loughrey | |
| 2003/0189829 A1 | 10/2003 | Shimizu et al. | |
| 2005/0281048 A1 | 12/2005 | Coushaine et al. | |
| 2006/0083281 A1 | 4/2006 | Inoguchi | |
| 2006/0086946 A1 | 4/2006 | Fung et al. | |
| 2006/0145173 A1 | 7/2006 | Lin et al. | |
| 2006/0157724 A1 | 7/2006 | Fujita | |
| 2007/0171676 A1 * | 7/2007 | Chang | 362/613 |
| 2008/0080165 A1 | 4/2008 | Kim et al. | |

FOREIGN PATENT DOCUMENTS

| | | |
|---|---|---|
| EP | 1 607 677 | 12/2005 |
| JP | 49-069293 | 7/1974 |
| JP | 05-275747 | 10/1993 |
| JP | 7-76133 | 3/1995 |
| JP | 2001-243821 | 9/2001 |
| JP | 2003-124528 | 4/2003 |
| JP | 2006-004935 | 1/2006 |
| JP | 2006-179658 | 7/2006 |
| JP | 2007-300138 | 11/2007 |
| WO | 2005/048362 | 5/2005 |
| WO | 2005/055328 | 6/2005 |

* cited by examiner

LIGHT-EMITTING APPARATUS

CROSS-REFERENCE TO RELATED APPLICATIONS

This application is a Continuation of U.S. Ser. No. 12/445,013, now U.S. Pat. No. 8,104,923, filed Apr. 9, 2009, which is a U.S. National Stage of PCT/JP2007/070306, filed Oct. 11, 2007, which applications are incorporated herein by reference.

TECHNICAL FIELD

The present invention relates to a light-emitting apparatus using a plurality of light-emitting elements.

BACKGROUND ART

A light-emitting element such as a light emitting diode (hereinafter, called a "LED") is used for various kinds of light-emitting devices. Owing not only to a decrease in size and an increase in efficiency of the LED compared with those of existing light sources utilizing discharge and radiation, but also an increase of a luminous flux of the LED that has been proceeded recently, it is possible to replace the existing light sources with the LED. For example, JP 2003-124528 A proposes a light-emitting module capable of realizing high optical output by mounting a number of LED chips on a card-shaped substrate at a high density.

The light-emitting module using a number of the LED chips described in JP 2003-124528 A is suitable for realizing a thin light-emitting module. However, since each LED chip is provided with an optical system that is constituted of an individual reflector or lens, an area of the whole module is increased.

DISCLOSURE OF INVENTION

It is an object of the present invention to solve the above-described conventional problem, and to provide a light-emitting apparatus having a point light source with high brightness.

The light-emitting apparatus of the present invention is light-emitting apparatus including: a storage case that includes a base board having a concave portion and a lid portion covering the concave portion; and a plurality of light-emitting elements that are disposed on an inner surface of the case, wherein an opening is formed in the lid portion, at least a part of the inner surface is a light-reflecting surface that wave-guides light emitted by the light-emitting elements as light sources to a position directly underneath the opening, and a reflecting portion that reflects the light emitted by the light-emitting elements as the light sources toward the opening is formed directly underneath the opening.

According to the light-emitting apparatus of the present invention, since outgoing light can be taken out intensively from the opening formed in the lid portion, the size of a light-emitting portion can be decreased. Moreover, since the light emitted by the plurality of the light-emitting elements is taken out from the opening formed in the lid portion, an intensity of the outgoing light can be increased. Thereby, the light-emitting apparatus having the point light source with the high brightness can be provided.

DESCRIPTION OF THE INVENTION

Figure 1A:
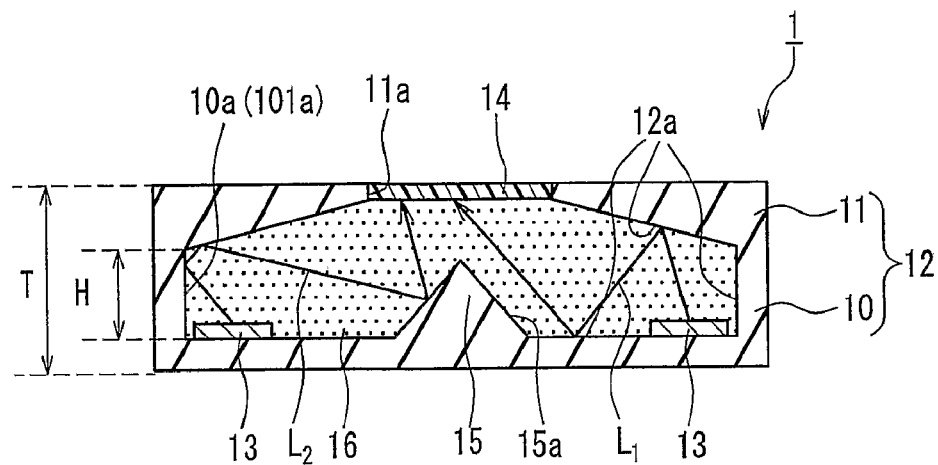
FIG. 1A is a cross-sectional view schematically showing a light-emitting apparatus according to Embodiment 1 of the present invention.

The light-emitting apparatus of the present invention includes: a storage case that includes a base board having a concave portion, and a lid portion covering the concave portion; and a plurality of light-emitting elements that are arranged on an inner surface of the case. The light-emitting elements are mounted on the inner surface by, for example, flip chip bonding or wire bonding. Incidentally, the number of the light-emitting elements is not limited particularly as long as it is two or more, and can be set appropriately according to the required light amount.

A material composing the base board is not limited particularly, and may be single crystals such as sapphire, Si, GaN, AlN, ZnO, SiC, BN and ZnS; ceramics such as $Al_2O_3$, AlN, BN, MgO, ZnO, SiC and C, and mixtures of them; metals such as Al, Cu, Fe, Au, W and alloys containing them; resins such as glass epoxy, epoxy resin, silicone resin, acrylic resin, urea resin, amide resin, imide resin, polycarbonate resin, polyphenylene sulfide resin, liquid crystal polymer, acrylonitrile-butadiene-styrene resin (ABS resin), methacrylate resin (PMMA resin) and cyclic olefin copolymer, and mixtures of them.

A material composing the lid portion also is not limited particularly, and may be the same as the materials for composing the base board described above. The base board and the lid portion may be adhered via an adhesive or the like, and may be made of the same material so as to be integrated for forming the case. That is, the lid portion is formed on a side of an opening for taking out light, and the base board is formed on a side of a reflecting portion, so that the lid portion and the base board may be integrated to constitute the case.

The opening is formed in the lid portion. An area of this opening may range, for example, from about 3% to about 30% with respect to an area of the lid portion. Thereby, since the outgoing light can be taken out from the opening intensively, a size of the light-emitting portion can be decreased.

At least one part of the inner surface of the storage case is a light-reflecting surface that wave-guides light emitted by the light-emitting elements as light sources to a position directly underneath the opening. Moreover, the reflecting portion that reflects the light emitted by the light-emitting elements as the light sources toward the opening is formed directly underneath the opening. Herein, the "light emitted by the light-emitting elements as the light sources" includes not only the light emitted by the light-emitting elements but also below-described converted light from a wavelength converting portion. According to this structure, the light that is wave-guided by the above-described light-reflecting surface can be reflected toward the opening. It should be noted that the light taken out from the light-emitting apparatus of the present invention necessarily is not only the light that is reflected by the inner surface of the storage case and reaches the reflecting portion, and is reflected by this reflecting portion and exits from the opening. For example, light that is emitted by the light-emitting element and reaches directly to the opening, and light that repeats the reflection on the inner surfaces of the storage case many times and reaches the opening without passing through the reflecting portion may be taken out from the light-emitting apparatus of the present invention. Also, light that is emitted by the light-emitting element and reaches directly to the reflecting portion and is reflected by this reflecting portion so as to reach the opening may be taken out as well. According to the light-emitting apparatus of the present invention, the light that is emitted by the plurality of the light-emitting elements is taken out from the opening formed in the lid portion, so that the intensity of the outgoing light can be increased. Further, a light taking-out efficiency of the light emitted by the light-emitting elements also can be increased. That is, an effect of decreasing a ratio of light that cannot outgo from the opening to the outside due to the repeated reflections by the inner surfaces of the storage case also is exhibited. Thereby, the light-emitting apparatus having the point light source with high brightness can be provided. Moreover, compared with the conventional light-emitting apparatus in which the light-emitting elements are disposed directly underneath the opening, the light-emitting elements can be spaced farther apart, and thus are less likely to be subjected to influences of heat from one another. Further, since the light-emitting elements serving as heat sources are disposed dispersedly, heat radiation can be achieved easily. It should be noted that all of the inner surfaces of the storage case are not required to be light-reflecting surfaces, as long as they can wave-guide the light emitted by the light-emitting elements as the light sources to the position directly underneath the opening. For example, the light-emitting elements may not be mounted on the light-reflecting surface. Moreover, a boundary between the reflecting portion that is provided directly underneath the opening and the light-reflecting surface around the reflecting portion is not necessarily clear, and a part constituted of the light-reflecting surface that extends toward the opening may be the reflecting portion. In this case, there is no boundary between the light-reflecting surface and the reflecting portion, so that interference of reflected light between the light-reflecting surface and the reflecting portion can be prevented. As a result, the uniform reflected light can be obtained, so that the outgoing light from the opening can be uniform. Moreover, in the case of providing the wavelength converting portion near the opening as described below, this wavelength converting portion can be irradiated with the reflected light uniformly, and as a result, uniform converted light can be obtained.

A surface of the reflecting portion may be a curved face. The reason for this is because the curved face enables the reflecting portion to control a light distribution of the outgoing light. Further, in the case of providing the wavelength converting portion near the opening, this wavelength converting portion can be irradiated with the reflected light uniformly, and as a result, the uniform converted light can be obtained.

As a material of the light-reflecting surface, metals such as Al, Ag, Au, Ni, Rh, Pd and alloys containing them; metal oxides such as aluminum oxide, cerium oxide, hafnium oxide, magnesium oxide, niobium oxide, tantalum oxide, zirconium oxide, zinc oxide, titanium oxide, yttrium oxide, silicon oxide, indium oxide, tin oxide, tungsten oxide and vanadium oxide; inorganic materials such as silicon nitride, gallium nitride, silicon carbide, calcium fluoride, calcium carbonate, copper sulfide, tin sulfide, zinc sulfide and barium sulfate; and mixtures of them may be used. In the case of using the metal oxide or the inorganic material in a powder state, an average particle diameter thereof preferably ranges from 0.3 μm to 3 μm in view of the reflecting effect that results from the diffusion and the scattering. Moreover, a distribution Bragg reflecting mirror (thickness: 0.1 μm to 1 μm) made of a multilayer film in which two or more kinds of these metal oxides and the inorganic materials are layered alternately also is effective as the material of the light-reflecting surface. Incidentally, a surface of the material composing the above-described base board also can be used directly as the light-reflecting surface. For example, the storage case can be made of a resin material or a ceramic material that has a high surface reflectance.

As a material of the surface of the reflecting portion, the same materials as the above-described materials of the light-reflecting surface can be used. A shape of the reflecting portion is not limited particularly, and may be a protrusion having an inclined surface that can reflect light reflected by the light-reflecting surface and the light from the light-emitting elements toward the opening. Incidentally, the lid portion and the base board may have a function of maintaining the above-described materials that constitute the light-reflecting surface and the reflecting portion, and at least a part of the lid portion and the base board may contain the above-described materials that constitute the light-reflecting surface and the reflecting portion.

As the light-emitting element, for example, a red LED that emits red light with a wavelength ranging from 600 nm to 660 nm, a yellow LED that emits yellow light with a wavelength ranging from 550 nm to 600 nm, a green LED that emits green light with a wavelength ranging from 500 nm to 550 nm, a blue LED that emits blue light with a wavelength ranging from 420 nm to 500 nm, a blue violet LED that emits blue violet light with a wavelength ranging from 380 nm to 420 nm or the like may be used. Also, a LED that is combined with a wavelength converting material such as a white LED that emits white light by the blue LED with, for example, a yellow phosphor, and a white LED that emits white light by a blue violet LED or a ultraviolet LED with, for example, a blue phosphor, a green phosphor or a red phosphor may be used. Moreover, a LED that emits near-infrared light (wavelength: 660 nm to 780 nm) or infrared light (wavelength: 780 nm to 2 μm) also may be used. As the red LED and the yellow LED, for example, a LED using an AlInGaP-based material can be used. Further, as the green LED, the blue LED, the blue violet LED and the ultraviolet LED, for example, a LED using an InGaAlN-based material can be used. As the LED that emits red to infrared light, for example, a LED using an AlGaAs-based material or an InGaAsP-based material can be used. A ratio of combining chemical elements of the LED materials of the each system of the light-emitting element that is formed by epitaxial growth is adjusted appropriately according to an emitted light wavelength. Also, a light-emitting element with a different emitted light wavelength may be provided in the case. For example, three types of the light-emitting elements of the blue LED, the green LED and the red LED also may be used. In this case, by adjusting the number of the light-emitting elements and values of currents to be applied to the respective light-emitting elements, various light-emitting colors including white can be achieved. Also, a pattern of the light distribution also can be changed, by selecting the light-emitting element to be turned ON among the plurality of the light-emitting elements appropriately and adjusting a light output of each of the light-emitting elements appropriately.

Moreover, as the light-emitting element of the present invention, a light-emitting element other than a LED also can be used. As the light-emitting element other than a LED, for example, a laser diode (a waveguide type, a plane light-emitting type or the like), an electroluminescence diode (inorganic, organic or the like) and the like can be exemplified. Since the merit of using the laser diode is that a size (diameter) of the light-emitting portion can be decreased to a level of several μm, a high light taking-out efficiency can be obtained optically when disposing the light-emitting elements at below-described focal points. In the case of the laser diode of the waveguide type, it also is capable of emitting light from both ends of the waveguide, and if disposing the laser diode such that a direction of the waveguide is perpendicular to a direction of the opening for taking out the light, the laser diode can wave-guide the light in the direction of the opening without shielding the light. Further, owing to the use of the laser diode, the light output that is higher than that of a LED can be obtained. Moreover, the electroluminescence diode can be thin, and thus can be disposed at a curved face portion of the inner surface of the case. For example, it also is possible to dispose the electroluminescence diode over the entire inner surface.

The light-emitting apparatus of the present invention further may be provided with a wavelength converting portion that contains a wavelength converting material for converting a wavelength of the light from the light-emitting elements, in at least a part of an optical path between the light-emitting elements and the opening inside the case. The reason for this is because the light from the light-emitting element and the converted light from the wavelength converting portion can be synthesized so as to take out white light, for example. Moreover, in this case, it is preferable that the plurality of the light-emitting elements respectively are disposed on a substantial concentric circle whose center is an axis that connects the opening and the reflecting portion. Since optical path lengths from the respective light-emitting elements to the opening are equalized, color irregularity of the light that is taken out from the opening can be prevented. In this specification, the term "substantial" used for describing a particular shape means not only the exact shape but also a modified shape having the same function. It should be noted that the wavelength converting material may be provided inside the storage case in a state of being dispersed in, for example, a below-described translucent material as a base material.

As the wavelength converting material, for example, a phosphor can be used. As the phosphor, for example, a red phosphor that generates red light, an orange phosphor that generates orange light, a yellow phosphor that generates yellow light and a green phosphor that generates green light can be used. As the red phosphor, for example, silicate-based $Ba_3MgSi_2O_8$: $Eu^{2+}$, $Mn^{2+}$, nitridosilicate-based $Sr_2Si_5N_8$: $Eu^{2+}$, nitridoaluminosilicate-based $CaAlSiN_3$: $Eu^{2+}$, oxonitridoaluminosilicate-based $Sr_2Si_4AlON_7$: $Eu^{2+}$, sulfide-based $(Sr,Ca)S$: $Eu^{2+}$ and $La_2O_2S$: $Eu^{3+}$, $Sm^{3+}$, and the like can be used. As the orange phosphor, for example, silicate-based $(Sr,Ca)_2SiO_4$: $Eu^{2+}$, garnet-based $Gd_3Al_5O_{12}$: $Ce^{3+}$, α-SIALON-based Ca-α-SiAlON: $Eu^{2+}$ and the like can be used. As the yellow phosphor, for example, silicate-based $(Sr,Ba)_2SiO_4$: $Eu^{2+}$ and $Sr_3SiO_5$: $Eu^{2+}$, garnet-based $(Y,Gd)_3Al_5O_{12}$: $Ce^{3+}$, sulfide-based $CaGa_2S_4$: $Eu^{2+}$, α-SIALON-based Ca-α-SiAlON: $Eu^{2+}$ and the like can be used. As the green phosphor, for example, aluminate-based $BaMgAl_{10}O_{17}$: $Eu^{2+}$, $Mn^{2+}$ and $(Ba,Sr,Ca)Al_2O_4$: $Eu^{2+}$, silicate-based $(Ba,Sr)_2SiO_4$: $Eu^{2+}$, α-SIALON-based. Ca-α-SiAlON: $Yb^{2+}$ and β-SIALON-based $β-Si_3N_4$: $Eu^{2+}$, oxonitridosilicate-based $(Ba,Sr,Ca)Si_2O_2N_2$: $Eu^{2+}$, oxonitridoaluminosilicate-based $(Ba,Sr,Ca)_2Si_4AlON_7$: $Ce^{3+}$, sulfide-based $SrGa_2S_4$: $Eu^{2+}$, garnet-based $Y_3(Al,Ga)_5O_{12}$: $Ce^{3+}$, oxide-based $CaSc_2O_4$: $Ce^{3+}$, and the like can be used.

Moreover, in the case of using the blue violet LED or the ultraviolet LED as the light-emitting element, for example, the above-described phosphor, a blue phosphor that generates blue light and a blue green phosphor that generates blue green light may be used in combination. As the blue phosphor, for example, aluminate-based $BaMgAl_{10}O_{17}$: $Eu^{2+}$, silicate-based $Ba_3MgSi_2O_8$: $Eu^{2+}$, halophosphate-based $(Sr,Ba)_{10}(PO_4)_6Cl_2$: $Eu^{2+}$, and the like can be used. As the blue green phosphor, for example, aluminate-based $Sr_4Al_{14}O_{25}$: $Eu^{2+}$, silicate-based $Sr_2Si_3O_8 \cdot 2SrCl_2$: $Eu^{2+}$ and the like can be used.

Further, as the wavelength converting material, a metal complex, an organic dye, an organic pigment, a phosphorescent substance or the like also can be used instead of the above-described phosphors. It also is possible to use a plurality of the wavelength converting materials in order to obtain a necessary color temperature and a necessary color rendering index. Also, a light-emitting element for emitting light having a wavelength that cannot be converted by the wavelength converting material may be disposed inside the case. For example, by combining the blue LED, the green phosphor and the red LED, a white light-emitting apparatus that exhibits a high efficiency and high color rendering can be realized.

The light-emitting apparatus of the present invention may have a configuration in which at least a part of the inner surfaces of the storage case is provided with the wavelength converting portion containing the wavelength converting material. The reason for this is because this configuration enables synthesizes of the light from the light-emitting elements and the converted light from the wavelength converting material so as to take out white light, for example. The wavelength converting material in this case may be the same as the above-listed specific examples of the wavelength converting material.

The light-emitting apparatus of the present invention further may include a wavelength converting portion that converts the wavelength of the light from the light-emitting elements, in or near the opening. The reason for this is because this configuration enables synthesizes of the light from the light-emitting elements and the converted light from the wavelength converting portion so as to take out white light, for example. The wavelength converting portion is made of, for example, the above-described wavelength converting material and a translucent material that serves as a base material for dispersing this wavelength converting material. In this case, it is preferable that the light-emitting apparatus except for the wavelength converting portion does not contain the wavelength converting material. The reason for this is because, by disposing the wavelength converting material concentratedly to the opening, the color irregularity of the light that is taken out from the opening can be prevented. Also, the wavelength converting portion may be formed to have a plate shape or a dome shape. The reason for this is because a thickness of the wavelength converting portion in an emitting direction of the light can be made uniform, thereby suppressing the color irregularity of the light that is taken out through the wavelength converting portion. The wavelength converting portion may be obtained by dispersing the wavelength converting material in the translucent material, or by forming a material, in which a garnet-based phosphor or the like is deposited in an inorganic substance such as glass or ceramics, to have a plate shape, a dome shape or the like. Moreover, if it is structured to attach the wavelength converting portion to the outside of the storage case detachably, a wavelength converting portion that is prepared in advance can be selected such that a designed value of light can be synthesized even if the wavelengths of the light-emitting elements are varied. Alternatively, the wavelength converting portion can be selected such that light suitable for the purpose can be synthesized. Moreover, when the wavelength converting portion deteriorates and initial functions thereof cannot be obtained, the wavelength converting portion can be replaced with a new one. In this case, a wavelength converting portion that has a different thickness, a different kind of a wavelength converting material to be contained or a different concentration may be prepared as appropriate.

As the translucent material serving as the base material of the wavelength converting portion, for example, resins such as epoxy resin, silicone resin, acrylic resin, urea resin, amide resin, imide resin, polycarbonate resin, polyphenylene sulfide resin, liquid crystal polymer, acrylonitrile-butadiene-styrene resin (ABS resin), methacrylate resin (PMMA resin) and cyclic olefin copolymer, and mixtures of them; glass such as glass made by a sol-gel from metal alkoxide or colloidal silica as a starting material method and low-melting glass can be used. The above-described translucent material does not contain the wavelength converting material, and also can be used simply as a support when applying a sealing material for the case, a window material of the opening or the wavelength converting material to the surface. Also, it is possible to use a composite material in which metal oxide particles are dispersed in these translucent materials, which serve as a base material. In this case, by adjusting an amount of the metal oxide particles to be dispersed in the base material, a refractive index of the wavelength converting portion can be adjusted, and a light-scattering effect can be obtained. Moreover, in the case of using a curable resin as the base material, when the metal oxide particles are dispersed in the curable resin that is in an uncured state, thixotropy of the curable resin before the cure is improved, so that the wavelength converting portion can be formed to have a predetermined shape easily. Further, a thermal conductivity is improved more than that in the case of using the resin alone, so that the heat from the light-emitting elements can be radiated more efficiently.

As the metal oxide particles, for example, particles made of $SiO_2$, $Al_2O_3$, $ZnO$, $Y_2O_3$, $TiO_2$, $ZrO_2$, $HfO_2$, $SnO_2$, $Ta_2O_3$, $Nb_2O_5$, $BaSO_4$, $V_2O_5$ or mixtures of them can be used, and an average particle diameter thereof preferably ranges from about 1 nm to about 100 nm in order to improve the adjustability of the refractive index and the thixotropy thereof. Incidentally, the above-described "average particle diameter" may be an average value of particle diameters of primary particles (an average value of the particle diameters of, for example, 100 primary particles) that are read out from an observed image of the scanning electron microscope, for example.

The light-emitting apparatus of the present invention also may have a configuration in which a plurality of cavities that are branched from the position directly underneath the opening are formed in the case, and at least one of the light-emitting elements is disposed at an end of each of the cavities. In this case, for example, the cavity is covered with the light-reflecting surface that wave-guides the light emitted by the light-emitting elements as the light sources to the position directly underneath the opening and the reflecting portion that reflects the light emitted by the light-emitting elements as the light sources toward the opening. According to this configuration, the light emitted by the light-emitting elements as the light sources can be wave-guided to the position directly underneath the opening more easily, so that the light taking-out efficiency from the opening can be increased.

The light-emitting apparatus of the present invention also may have a configuration in which the light-reflecting surface spreads out toward the position directly underneath the opening. The reason for this is because the light emitted by the light-emitting elements as the light sources can be wave-guided to the position directly underneath the opening more easily, thereby increasing the light taking-out efficiency from the opening The light-emitting apparatus of the present invention also may have a configuration of providing a material (high-refractive-index material), which has a refractive index higher than that of other region in the case, directly underneath the opening in the case. Since light gathers to a part having a high refractive index, the light emitted by the light-emitting elements as the light source can be wave-guided to the position directly underneath the opening more easily. Thereby, the light taking-out efficiency from the opening can be increased. Incidentally, the material that is disposed in the other region is a material having a refractive index lower than that of the high-refractive-index material, and is not limited particularly as long as it allows at least a part of the light emitted by the light-emitting elements as the light source to transmit, which may be, for example, resins, glass or the like. Moreover, the other region may be a hollow (refractive index: 1).

As the high-refractive-index material, various kinds of materials can be used as long as it allows at least a part of the light emitted by the light-emitting elements as the light source to transmit. For example, metal oxides such as aluminum oxide (refractive index: 1.63), cerium oxide (refractive index: 2.2), hafnium oxide (refractive index: 1.95), magnesium oxide (refractive index: 1.74), niobium oxide (refractive index: 2.33), tantalum oxide (refractive index: 2.16), zirconium oxide (refractive index: 2.05), zinc oxide (refractive index: 2.1), titanium oxide (refractive index: 2.4), yttrium oxide (refractive index: 1.87), silicon oxide (refractive index: 1.5), indium oxide (refractive index: 2), tin oxide (refractive index: 2), tungsten oxide (refractive index: 2.2) and vanadium oxide (refractive index: 2.0); inorganic materials such as silicon nitride (refractive index: 1.9), gallium nitride (refractive index: 2.5), silicon carbide (refractive index: 2.6), calcium fluoride (refractive index: 1.43), calcium carbonate (refractive index: 1.58), barium sulfate (refractive index: 1.64), copper sulfide (refractive index: 2.1), tin sulfide (refractive index: 2.0) and zinc sulfide (refractive index: 2.37); diamond (refractive index: 2.4); and mixtures of them can be used. Herein, the values of the refractive indices in the above brackets represent refractive indices of the respective materials with respect to light with a wavelength of 550 nm.

Also, as the high-refractive-index material, resins such as epoxy resin, silicone resin, acrylic resin, urea resin, amide resin, imide resin, polycarbonate resin, polyphenylene sulfide resin, liquid crystal polymer, acrylonitrile-butadiene-styrene resin (ABS resin), methacrylate resin (PMMA resin) and cyclic olefin copolymer, mixtures of them, and glass such as low-melting glass may be used. In the case of using the translucent materials such as these resins and glass, these translucent materials may be irradiated with electron beams or ion beams (hydrogen ion beams, helium ion beams or the like) so as to increase the refractive indices thereof. Moreover, a composite material obtained by dispersing a nanoparticle material made of the above-listed metal oxides or inorganic materials in these translucent materials serving as a base material also can be used. In this case, by adjusting an amount of the nanoparticle material to be dispersed in the base material, a refractive index of the composite material can be adjusted. Incidentally, in the case of using the light-emitting apparatus of the present invention as a white light source, the above-described wavelength converting material may be dispersed in the high-refractive-index material.

The light-emitting apparatus of the present invention also may have a configuration in which, in a cross section that is taken along at least one of the light-emitting elements and the reflecting portion in a direction perpendicular to a bottom surface of the base board, a cross-sectional shape of a part of the light-reflecting surface is a substantial parabola that spreads out toward the reflecting portion, and the at least one of the light-emitting elements is disposed at a substantial focal position of the parabola. The reason for this is because this configuration enables increase of the light taking-out efficiency from the opening, because the light, which is emitted by the light-emitting element that is disposed at the substantial focal position of the parabola and is reflected by the light-reflecting surface having the parabola, goes straightly toward the reflecting portion. In the present specification, the term "substantial focal position" means not only the focal position itself but also the position in the vicinity of the focal position.

Hereinafter, embodiments of the present invention will be described in detail. In the drawings, the components having substantially the same function are denoted by the same reference numerals, and the explanation will not be repeated. Moreover, for the purpose of simplifying the drawings and easier recognition, illustration of a metal wiring and a feeding terminal that is provided on an outside of a light-emitting apparatus is omitted in some of the referred drawings.

(Embodiment 1)

Figure 1B:
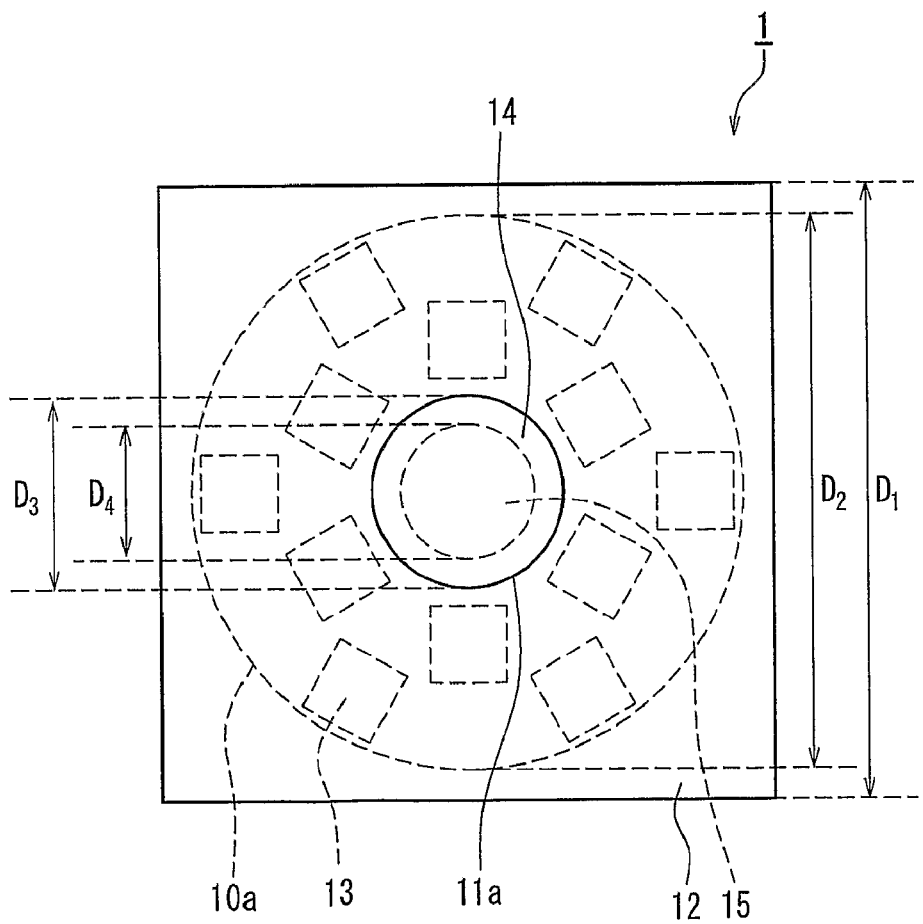
FIG. 1B is a top view schematically showing the light-emitting apparatus that is shown in FIG. 1A.

FIG. 1A is a cross-sectional view schematically showing a light-emitting apparatus according to Embodiment 1 of the present invention, and FIG. 1B is a top view schematically showing the light-emitting apparatus that is shown in FIG. 1A.

As shown in FIGS. 1A and 1B, the light-emitting apparatus 1 includes a storage case 12 provided with a base board 10 having a concave portion 10a and a lid portion 11 covering the concave portion 10a that are formed in an integrated manner, and a plurality of light-emitting elements 13 that are disposed on an inner surface 12a of the storage case 12. An opening 11a is formed in the lid portion 11, and is closed by a window portion 14 that is made of glass, a transparent resin or the like. Incidentally, an optical member such as a convex lens may be disposed on the window portion 14.

The inner surface 12a is a light-reflecting surface that wave-guides light emitted by the light-emitting elements 13 as light sources to a position directly underneath the opening 11a. And, a reflecting portion 15 including an inclined surface 15a that reflects the light emitted by the light-emitting elements 13 as the light sources toward the opening 11a is formed directly underneath the opening 11a. The reflecting portion 15 is formed to have a substantial conical shape. According to this configuration, the light $L_1$ that is emitted by the light-emitting elements 13 and is reflected by the inner surface 12a can be gathered to the opening 11a. Also, the light $L_2$ that is emitted by the light-emitting elements 13, is reflected by the inner surface 12a and then reaches the reflecting portion 15 can be reflected by the inclined surface 15a so as to be gathered to the opening 11a. In the light-emitting apparatus 1, the light emitted by the plurality of the light-emitting elements 13 is taken out from the opening 11a that is formed in the lid portion 11, thereby increasing an intensity of outgoing light.

Moreover, as shown in FIG. 1A, the light-emitting apparatus 1 further includes a wavelength converting portion 16 that is filled inside the storage case 12 converts a wavelength of the light from the light-emitting elements 13. Thereby, by synthesizing the light from the light-emitting elements 13 and converted light from the wavelength converting portion 16, white light can be taken out.

Moreover, as shown in FIG. 1B, the plurality of the light-emitting elements 13 respectively are disposed on a substantial concentric circle whose center is the opening 11a. Thereby, optical path lengths from the respective light-emitting elements 13 to the opening 11a are equalized, so that color irregularity of the light that is taken out from the opening 11a can be prevented.

Next, an example of a dimension of the light-emitting apparatus 1 will be described. A thickness T (see FIG. 1A) of the storage case 12 may range from about 2 mm to about 10 mm, for example. A height H (see FIG. 1A) of the inner wall side surface 101a of the concave portion 10a may range from about 1 mm to about 9 mm, for example. An upper surface of the storage case 12 may have a square shape whose length $D_1$ (see FIG. 1B) of one side may range from about 4 mm to about 20 mm, for example. A diameter $D_2$ (see FIG. 1B) of a bottom surface of the concave portion 10a may range from about 3 mm to about 19 mm, for example. A diameter $D_3$ (see FIG. 1B) of the opening 11a may range from about 2 mm to about 10 mm, for example. A diameter $D_4$ (see FIG. 1B) of a bottom surface of the reflecting portion 15 may range from about 1 mm to about 15 mm, for example. Incidentally, the figure shows as $D_3 > D_4$, but it also may be $D_3 \leqq D_4$. Moreover, the figure shows an example where the light-emitting elements 13 are disposed on double concentric circles around the opening 11a as a center, but the light-emitting elements 13 may be disposed on a single circle, or three or more concentric circles.

(Embodiment 2)

Figure 2A:
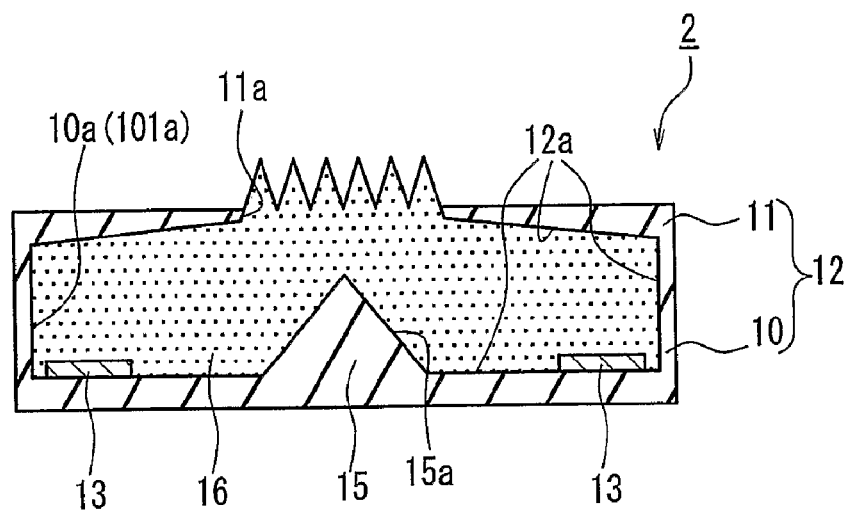
FIG. 2A is a cross-sectional view schematically showing a light-emitting apparatus according to Embodiment 2 of the present invention.
Figure 2B:
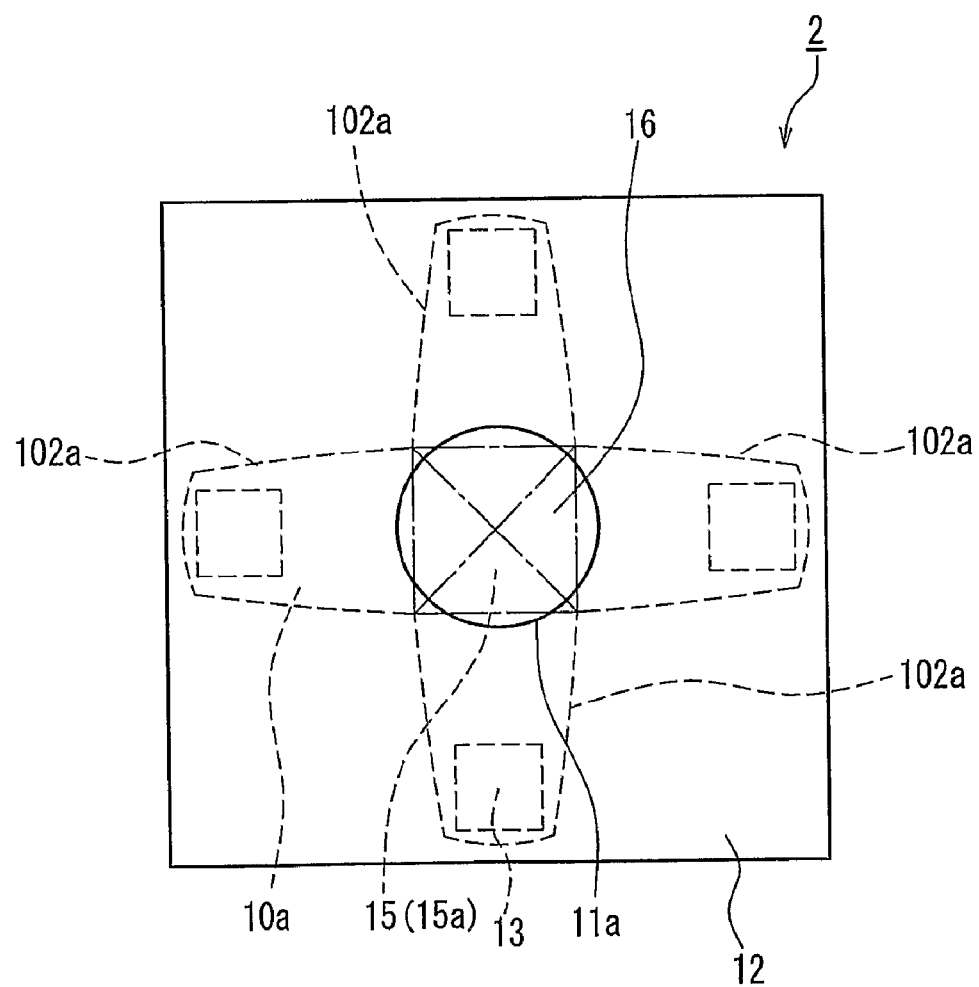
FIG. 2B is a top view schematically showing the light-emitting apparatus that is shown in FIG. 2A.

FIG. 2A is a cross-sectional view schematically showing a light-emitting apparatus according to Embodiment 2 of the present invention, and FIG. 2B is a top view schematically showing the light-emitting apparatus that is shown in FIG. 2A.

As shown in FIG. 2A, in the light-emitting apparatus 2, a part of the wavelength converting portion 16 protrudes from the opening 11a, and this protruding part has a concave/convex shape. Thereby, total reflection of the light that is incident into the opening 11a can be prevented, so that the light can be taken out efficiently. Moreover, as shown in FIG. 2B, in the storage case 12, four cavities 102a that are branched from the position directly underneath the opening 11a are formed, and an end of each of the cavities 102a is provided with one of the light-emitting elements 13. The cavities 102a are covered with the inner surface (light-reflecting surface) 12a that wave-guides the light emitted by the light-emitting elements 13 as the light sources to the position directly underneath the opening 11a and the reflecting portion 15 that reflects the light emitted by the light-emitting elements 13 as the light sources toward the opening 11a. According to this configuration, the light emitted by the light-emitting elements 13 as the light sources can be wave-guided to the position directly underneath the opening 11a (that is, the reflecting portion 15) more easily. Moreover, the reflecting portion 15 is formed to have a substantial quadrangular pyramid shape, and its four inclined surfaces 15a are disposed at positions that face the cavities 102a, respectively. Thereby, the light taking-out efficiency from the opening 11a can be increased. Configurations other than this are the same as that of the above-described light-emitting apparatus 1 (see FIGS. 1A and 1B).

(Embodiment 3)

Figure 3A:
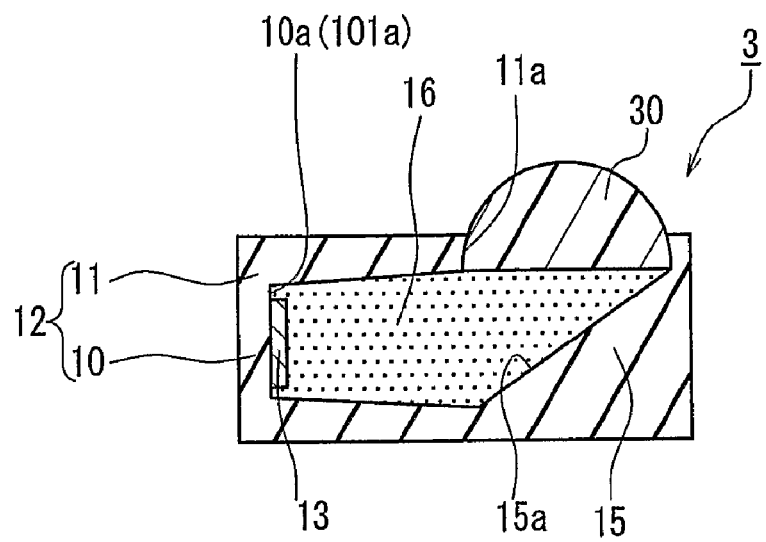
FIG. 3A is a cross-sectional view schematically showing a light-emitting apparatus according to Embodiment 3 of the present invention.
Figure 3B:
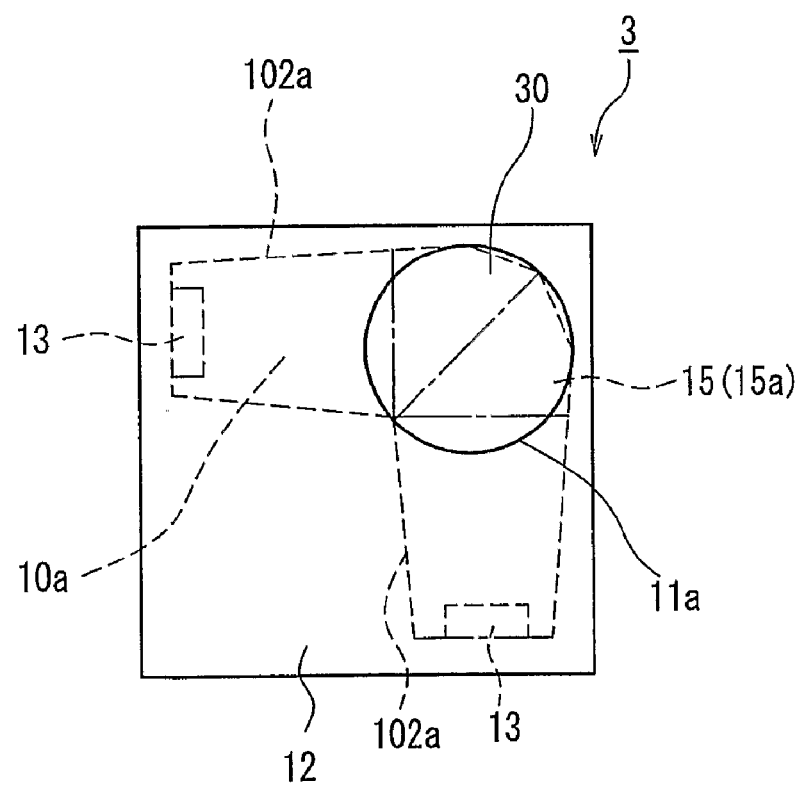
FIG. 3B is a top view schematically showing the light-emitting apparatus that is shown in FIG. 3A.

FIG. 3A is a cross-sectional view schematically showing a light-emitting apparatus according to Embodiment 3 of the present invention, and FIG. 3B is a top view schematically showing the light-emitting apparatus that is shown in FIG. 3A.

As shown in FIGS. 3A and 3B, a light-emitting apparatus 3 has the two cavities 102a that are connected with each other at a substantially right angle, and the inner wall side surface 101a that corresponds to the end of each of the cavities 102a is provided with one of the light-emitting elements 13. Moreover, a convex lens 30 that closes the opening 11a is included. Configurations other than these are the same as that of the above-described light-emitting apparatus 2 (see FIGS. 2A and 2B). In the light-emitting apparatus 3, the light-emitting elements 13 are disposed at positions facing the reflecting portion 15, so that the light emitted by the light-emitting elements 13 as the light sources can be wave-guided to the reflecting portion 15 more easily. Thus, the light taking-out efficiency from the opening 11a can be increased.

(Embodiment 4)

Figure 4A:
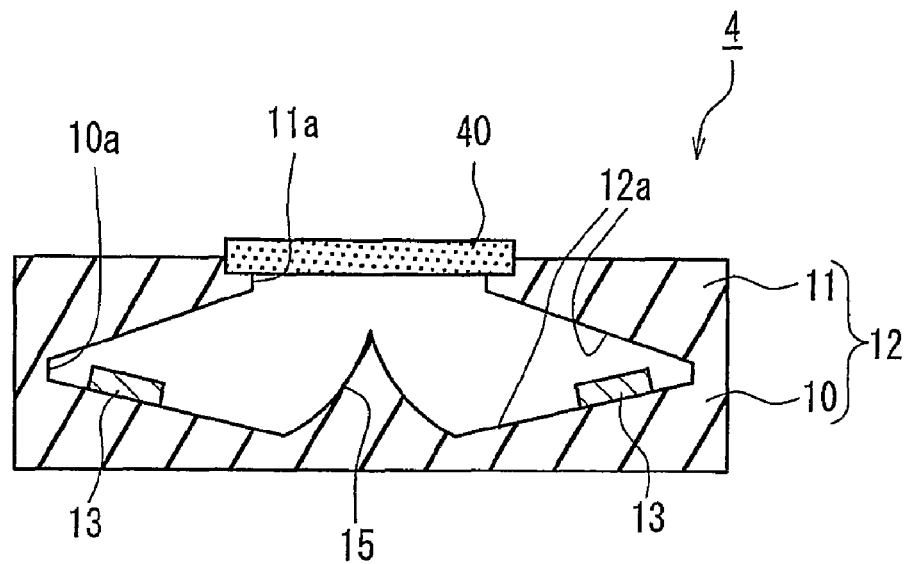
FIG. 4A is a cross-sectional view schematically showing a light-emitting apparatus according to Embodiment 4 of the present invention.
Figure 4B:
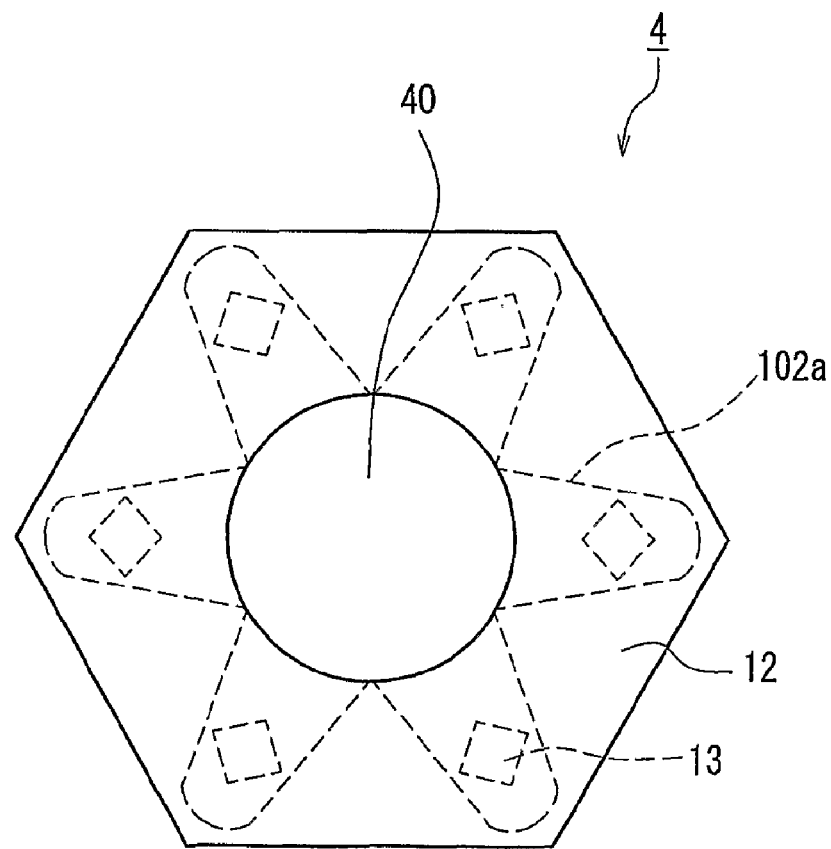
FIG. 4B is a top view schematically showing the light-emitting apparatus that is shown in FIG. 4A.

FIG. 4A is a cross-sectional view schematically showing a light-emitting apparatus according to Embodiment 4 of the present invention, and FIG. 4B is a top view schematically showing the light-emitting apparatus that is shown in FIG. 4A.

As shown in FIGS. 4A and 4B, the light-emitting apparatus 4 has the six cavities 102a, the end of each of the cavities 102a is provided with one of the light-emitting elements 13. Moreover, a wavelength converting portion 40 that is formed to cover the opening 11a is provided on the outside of the storage case 12. The wavelength converting portion 40 has a plate shape, and includes a wavelength converting material that converts the wavelength of the light from the light-emitting elements 13. The light-emitting apparatus 4 except for the wavelength converting portion 40 does not include the wavelength converting material. In the light-emitting apparatus 4, by disposing the wavelength converting material concentratedly to the opening 11a, the color irregularity of the light that is taken out from the opening 11a can be prevented. Moreover, the inner surface 12a serving as the light-reflecting surface spreads out toward the position directly underneath the opening 11a (that is, the reflecting portion 15). Thereby, the light emitted by the light-emitting elements 13 as the light sources can be wave-guided toward the reflecting portion 15 more easily, so that the light taking-out efficiency from the opening 11a can be increased. Incidentally, when the inside of the storage case 12 is structured to be hollow, an inert gas such as Ar and nitrogen, a dry gas or the like may be filled therein, and if sealing the storage case 12, a translucent material may be filled therein. Configurations other than these are the same as that of the above-described light-emitting apparatus 2 (see FIGS. 2A and 2B).

(Embodiment 5)

Figure 5A:
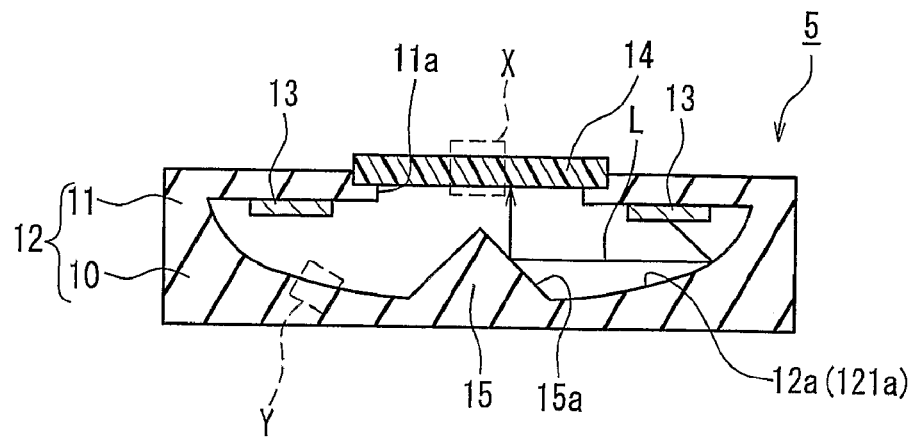
FIG. 5A is a cross-sectional view schematically showing a light-emitting apparatus according to Embodiment 5 of the present invention.
Figure 5B:
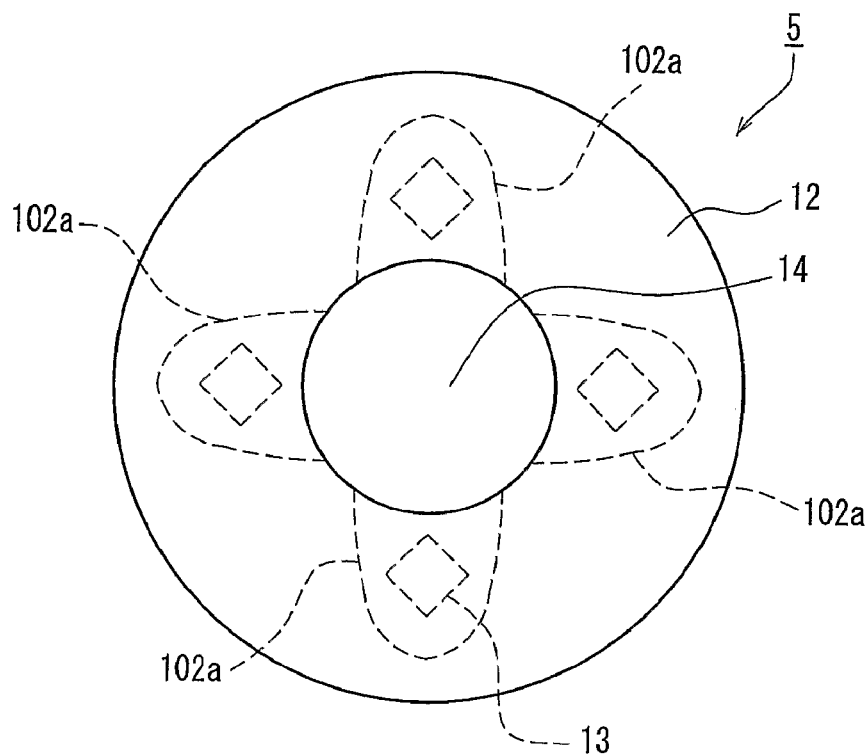
FIG. 5B is a top view schematically showing the light-emitting apparatus that is shown in FIG. 5A.

FIG. 5A is a cross-sectional view schematically showing a light-emitting apparatus according to Embodiment 5 of the present invention, and FIG. 5B is a top view schematically showing the light-emitting apparatus that is shown in FIG. 5A.

As shown in FIG. 5A, in a light-emitting apparatus 5, a cross-sectional shape of one part of 121a of the inner surface 12a serving as the light-reflecting surface has a substantial parabola that spreads out toward the reflecting portion 15. And, the light-emitting elements 13 are disposed at substantial focal positions of the parabola. That is, the one part 121a of the inner surface 12a is constituted of a part of a face that is obtained by rotating the substantial parabola around an axis that connects the two light-emitting elements 13 in FIG. 5A. Thereby, light L that is emitted by the light-emitting elements 13 and is reflected by the one part 121a of the inner surface 12a having the above-described substantial parabola goes straightly toward the reflecting portion 15, so that the light taking-out efficiency from the opening 11a is increased.

Moreover, as shown in FIG. 5B, the light-emitting apparatus 5 has the four cavities 102a, and the end of each of the cavities 102a is provided with one light-emitting element 13. Incidentally, if the inside of the storage case 12 is structured to be hollow, an inert gas such as Ar and nitrogen, a dry gas or the like may be filled therein, and if sealing the storage case 12, a translucent material may be filled therein. Moreover, the inner surface 12a (light-reflecting surface) having the above-described substantial parabola may be a smooth curved face or a substantially curved face obtained by combining flat planes.

Figure 5C:
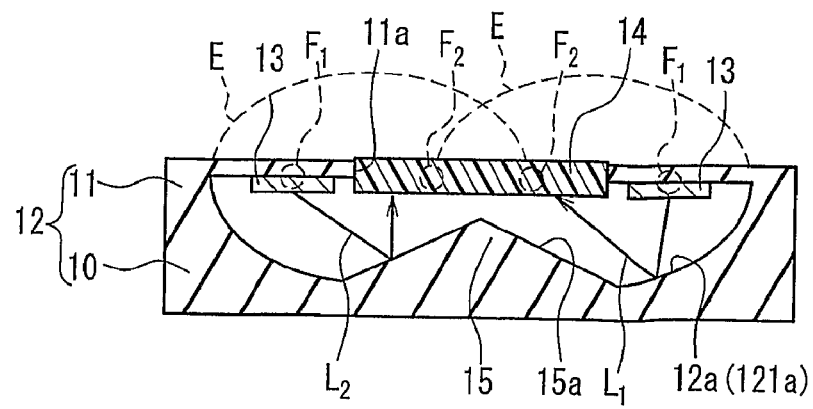
FIG. 5C is a cross-sectional view schematically showing a modified example of the light-emitting apparatus that is shown in FIG. 5A.

Further, the one part 121a of the inner surface 12a may be an arc shape of a substantial ellipse E shown in FIG. 5C. In this case, if disposing the light-emitting element 13 at a first focal point $F_1$ of the substantial ellipse E, the light $L_1$ that is emitted by the light-emitting elements 13 and is reflected by the one part 121a of the inner surface 12a gathers to the opening 11a (window portion 14) that is provided at a second focal point $F_2$ of the substantial ellipse E. Incidentally, the outgoing light from the opening 11a (window portion 14) of FIG. 5C may include not only the above-described light $L_1$ but also light $L_2$ that is emitted by the light-emitting elements 13 so as to reach the reflecting portion 15 directly, and then is reflected by the reflecting portion 15 so as to reach the opening 11a (window portion 14). The light-reflecting surface of the above-described substantial ellipse may be not only a smooth curved face but also a substantially curved face obtained by combining flat planes. Moreover, the two focal points $F_2$ positioned in the window portion 14 in the figure may be overlapped with each other.

Figure 6A:
FIGS. 6A and 6B are cross-sectional views showing an example of the X portion in FIG. 5A, and FIGS. 6C and 6D are cross-sectional views showing an example of the Y portion in FIG. 5A.
Figure 6B:
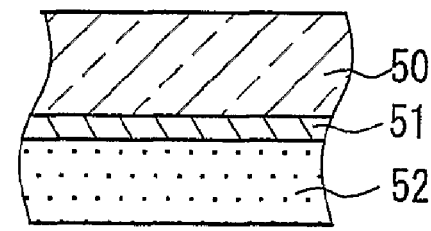

Next, variations of an X portion and a Y portion (see FIG. 5A) of the light-emitting apparatus 5 will be described. FIGS. 6A and 6B are cross-sectional views showing an example of the X portion in FIG. 5A, and FIGS. 6C and 6D are cross-sectional views showing an example of the Y portion in FIG. 5A.

The X portion may be formed only of a window material 50 such as glass, quartz, sapphire and aluminum nitride as shown in FIG. 6A, or may have a configuration in which an ultraviolet light reflecting layer 51 and a wavelength converting portion 52 are layered in this order on an inside surface of the window material 50 as shown in FIG. 6B. Also, the window material 50 can be made of the above-described phosphor alone. A material composing the ultraviolet light reflecting layer 51 is not limited particularly, as long as it can reflect ultraviolet light and allows only visible light to transmit, and, for example, metal oxides such as aluminum oxide, cerium oxide, hafnium oxide, magnesium oxide, niobium oxide, tantalum oxide, zirconium oxide, zinc oxide, titanium oxide, yttrium oxide, silicon oxide, indium oxide, tin oxide, tungsten oxide and vanadium oxide, and mixtures of them can be used. In the case of using the metal oxide in a powder state, the metal oxide having an average diameter ranging from 10 nm to 100 nm is preferably used by being layered to provide a thickness ranging from 100 nm to 300 nm, in the light of reflecting efficiency. Moreover, a multilayer film band-pass filter (thickness: 100 nm to 300 nm) that is obtained by layering two or more kinds of these metal oxides alternately by sputtering or the like is effective as the material of the ultraviolet light reflecting layer 51.

Figure 6C:
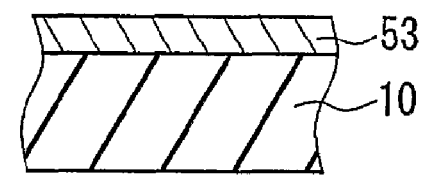
Figure 6D:
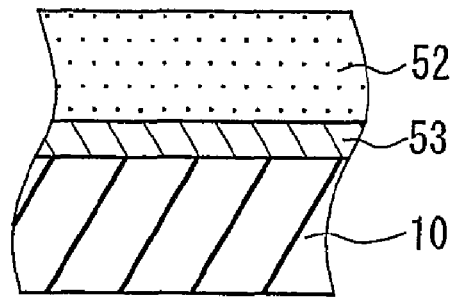

The Y portion may have a configuration in which the light-reflecting layer 53 is formed on an inner wall of the base board 10 as shown in FIG. 6C, or may have a configuration in which the light-reflecting layer 53 and the wavelength converting portion 52 are layered in this order on the inner wall of the base board 10 as shown in FIG. 6D. As a material composing the light-reflecting layer 53, the same materials listed above as the light-reflecting surface may be used.

(Embodiment 6)

Figure 7A:
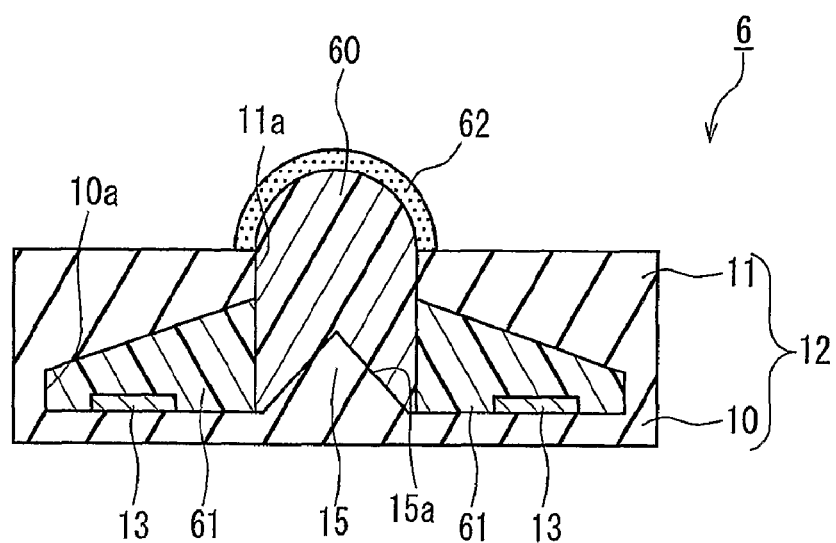
FIG. 7A is a cross-sectional view schematically showing a light-emitting apparatus according to Embodiment 6 of the present invention.
Figure 7B:
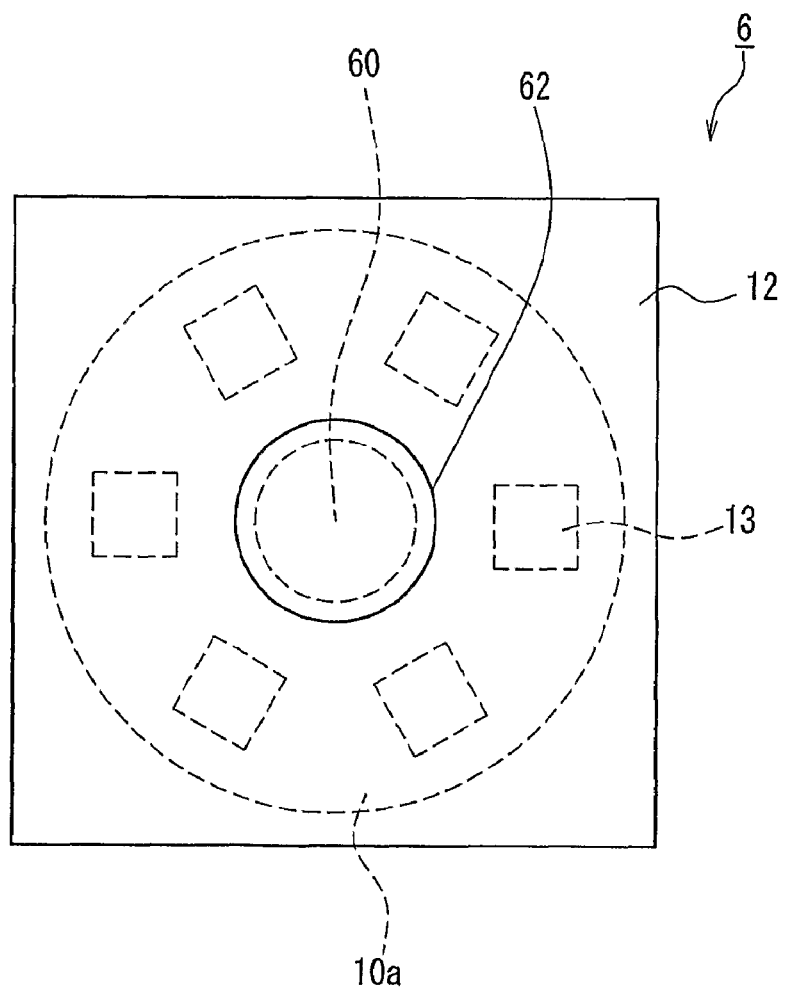
FIG. 7B is a top view schematically showing the light-emitting apparatus that is shown in FIG. 7A.

FIG. 7A is a cross-sectional view schematically showing a light-emitting apparatus according to Embodiment 6 of the present invention, and FIG. 7B is a top view schematically showing the light-emitting apparatus that is shown in FIG. 7A.

As shown in FIGS. 7A and 7B, in a light-emitting apparatus 6, a high refractive index material 60 having a substantially hemisphere shape, which protrudes from the position directly underneath the opening 11a in the storage case 12 toward the opening 11a, is disposed. Moreover, in other region in the storage case 12, a low refractive index material 61 that has a refractive index lower than that of the high refractive index material 60 is disposed. Thereby, the light emitted by the light-emitting elements 13 as the light sources can be gathered to the high refractive index material 60, so that the light taking-out efficiency from the opening 11a can be increased. Moreover, a wavelength converting portion 62 having a dome shape is formed outside the storage case 12 so as to cover the protruded high refractive index material 60. Thereby, a thickness of the wavelength converting portion 62 can be made uniform, so that color irregularity of light that is taken out through the wavelength converting portion 62 can be suppressed. Incidentally, as the high refractive index material 60, for example, a composite material or the like in which a nanoparticle material is dispersed in a transparent resin or glass can be used. Further, the low refractive index material 61 may be a material having the refractive index lower than that of the high refractive index material 60, and for example, a transparent resin, glass or the like can be used.

In Embodiments 4 and 6, if the wavelength converting portion is attached to the outside of the storage case detachably, a wavelength converting portion that is prepared in advance can be selected such that a designed value of light can be synthesized even if the wavelengths of the light-emitting elements are varied. Alternatively, the wavelength converting portion can be selected such that light suitable for the purpose can be synthesized. Moreover, when the wavelength converting portion deteriorates and initial functions thereof cannot be obtained, the wavelength converting portion can be replaced with a new one. In this case, a wavelength converting portion that has a different thickness, a different kind of a wavelength converting material to be contained or a different concentration may be prepared as appropriate.

Embodiments of the light-emitting apparatus of the present invention have been described above, but the present invention is not limited to the above-described embodiments, and the light-emitting apparatus of the present invention may have configurations shown in schematic cross-sectional views of FIGS. 8 to 13, for example.

Figure 8:
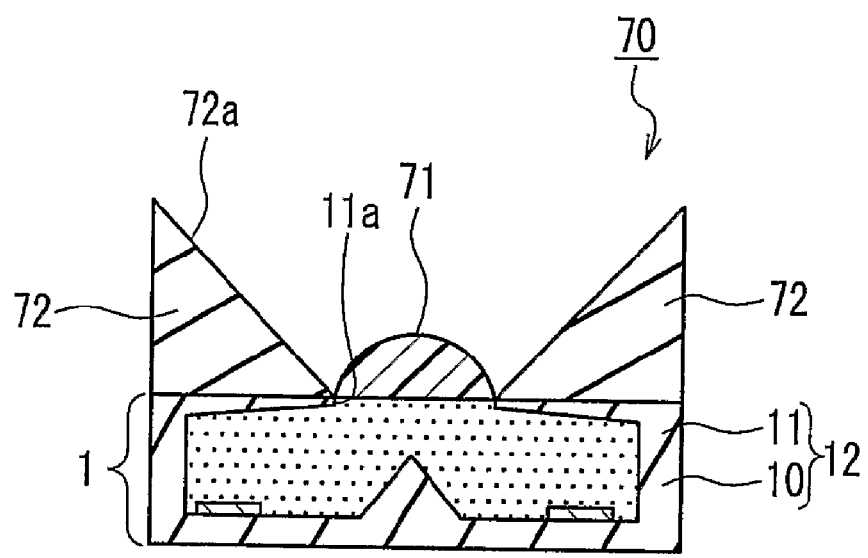
FIG. 8 is a cross-sectional view schematically showing a light-emitting apparatus according to an embodiment of the present invention.

A light-emitting apparatus 70 shown in FIG. 8 uses the light-emitting apparatus 1 according to Embodiment 1 described above. The light-emitting apparatus 70 further includes a convex lens 71 that closes the opening 11a and a reflector 72 that is disposed on the storage case 12 so as to expose this convex lens 71. This reflector 72 has a light-reflecting surface 72a. Thereby, a radiation pattern of the outgoing light can be controlled. Incidentally, for the reflector 72, ceramics, metals, resins and the like that are exemplified above as the base board material can be used.

Figure 9:
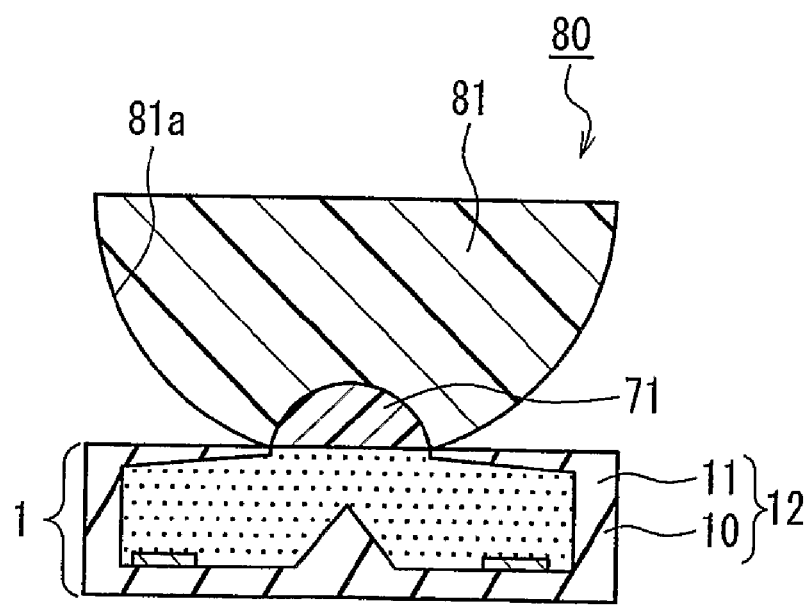
FIG. 9 is a cross-sectional view schematically showing a light-emitting apparatus according to an embodiment of the present invention.

In a light-emitting apparatus 80 shown in FIG. 9, a flat lens 81 is provided on the storage case 12 so as to cover the convex lens 71. The flat lens 81 has a light-reflecting surface 81a. Thereby, the radiation pattern of the outgoing light can be controlled.

Figure 10:
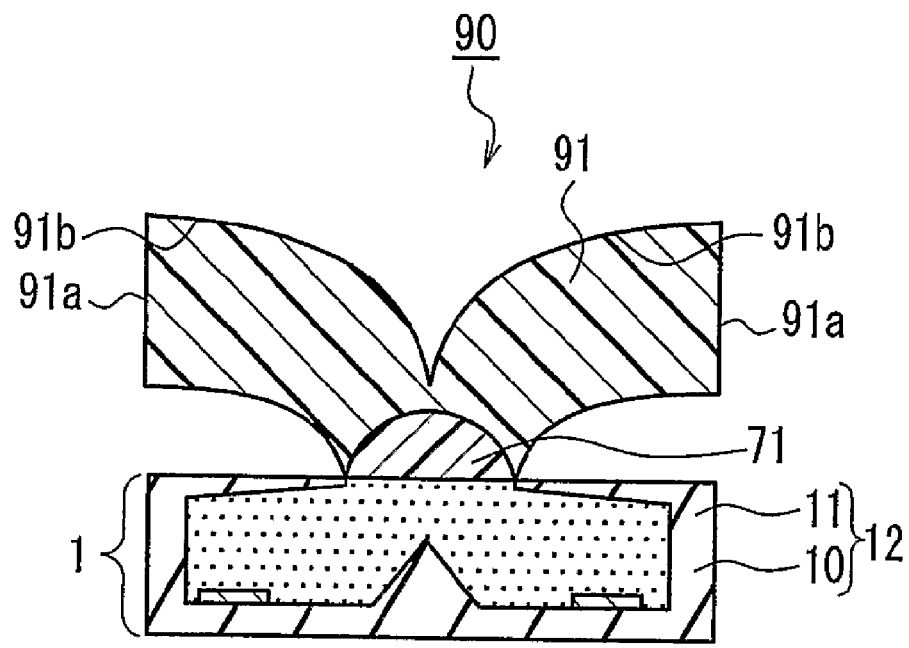
FIG. 10 is a cross-sectional view schematically showing a light-emitting apparatus according to an embodiment of the present invention.

In a light-emitting apparatus 90 shown in FIG. 10, a lens 91 that spreads out from the convex lens 71 as a center so as to have a parabolic shape is provided on the storage case 12. An upper portion 91b on a lens inner surface of this lens 91 is a light-reflecting surface. Thereby, light can be emitted from an end surface 91a of the lens 91.

Figure 11:
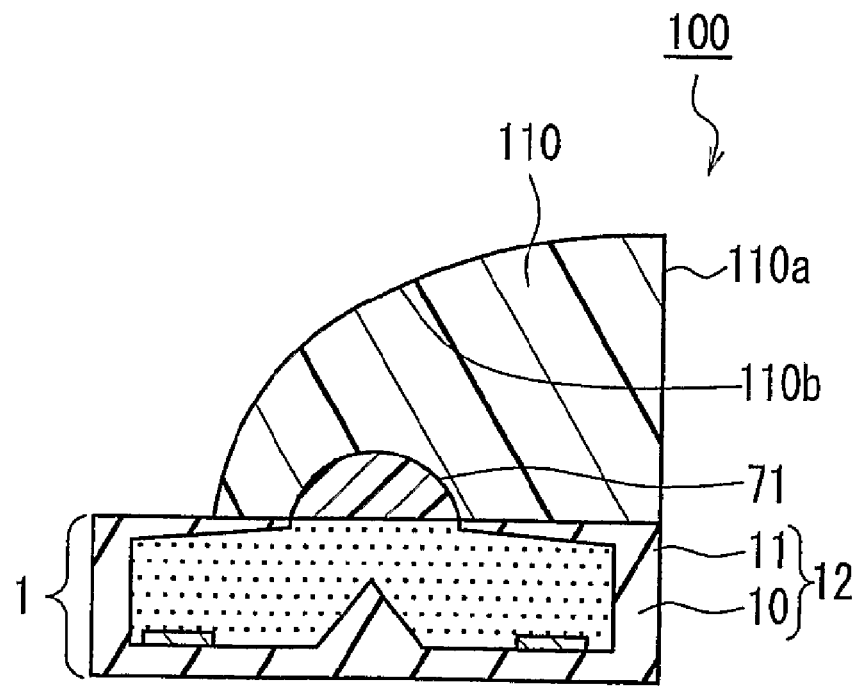
FIG. 11 is a cross-sectional view schematically showing a light-emitting apparatus according to an embodiment of the present invention.

In a light-emitting apparatus 100 shown in FIG. 11, a lens 110 is provided on the storage case 12 so as to cover the convex lens 71. The lens 110 has an asymmetrical shape with respect to a vertex of the convex lens 71. Moreover, an upper portion 110b on a lens inner surface of the lens 110 is a light-reflecting surface. Thereby, light can be emitted from an end surface 110a of the lens 110. Thus, the light-emitting apparatus 100 also can be applied to an illumination apparatus that illuminates only in a certain direction such as a front light of a car (that is, a front light that is designed such that an emitting direction toward an opposite lane for oncoming cars is lower than an emitting direction toward a lane for pedestrians so as not to impair the vision of a driver of an oncoming car), for example.

Figure 12:
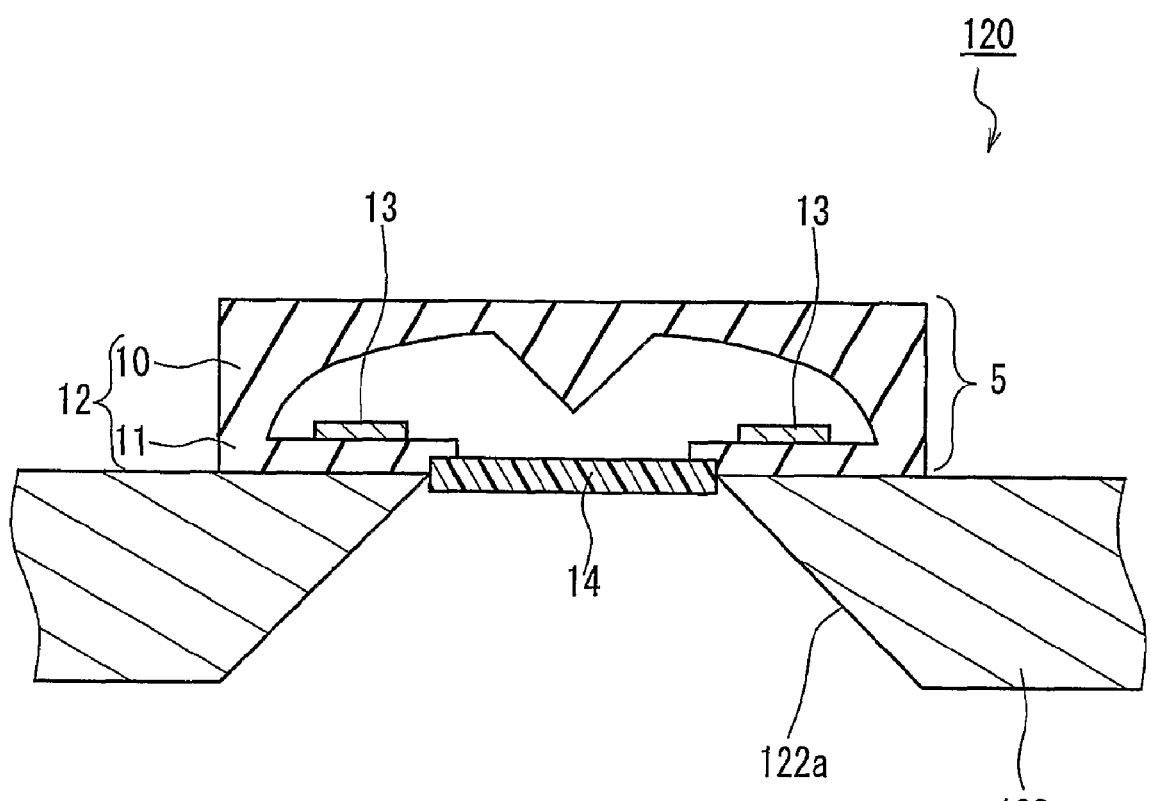
FIG. 12 is a cross-sectional view schematically showing a light-emitting apparatus according to an embodiment of the present invention.

As a light-emitting apparatus 120 shown in FIG. 12, the light-emitting apparatus 5 according to Embodiment 5 described above is used. The light-emitting apparatus 120 further includes a high heat radiation substrate 122 that is fixed to the storage case 12 so as to expose the window portion 14. As the high heat radiation substrate 122, for example, metals having high thermal conductivities such as aluminum and copper, ceramics or the like having high thermal conductivities such as $Al_2O_3$ and AlN can be used. Thereby, the heat generated by the light-emitting elements 13 can be radiated efficiently. Moreover, this high heat radiation substrate 122 has a light-reflecting surface 122a. Thereby, a radiation pattern of the outgoing light can be controlled. As described above, by combining with the optical system provided outside the window portion 14, the light distribution can be controlled variously.

Figure 13:
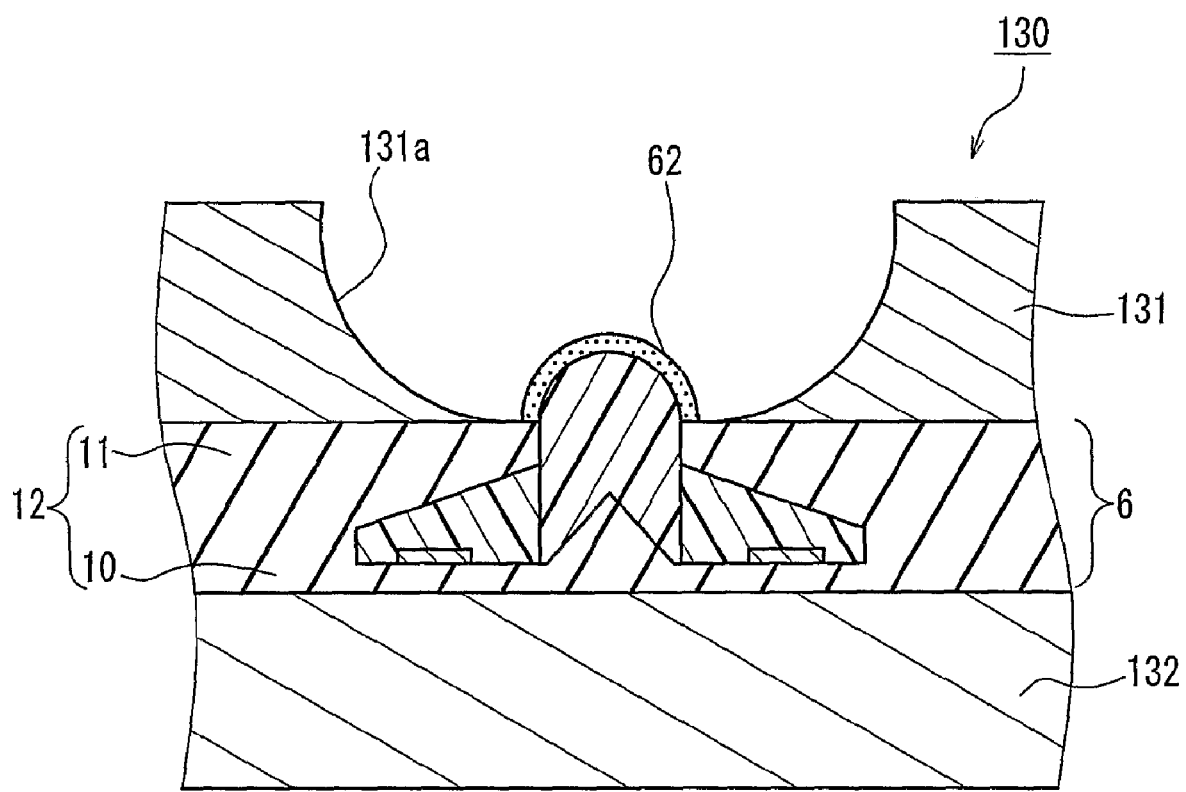
FIG. 13 is a cross-sectional view schematically showing a light-emitting apparatus according to an embodiment of the present invention.

As a light-emitting apparatus 130 shown in FIG. 13, the light-emitting apparatus 6 according to Embodiment 6 described above is used. The light-emitting apparatus 130 further includes a reflector 131 that is fixed to the storage case 12 so as to expose the wavelength converting portion 62, and a high heat radiation substrate 132 that is fixed on a bottom surface of the storage case 12. The reflector 131 has a light-reflecting surface 131a. Thereby, a radiation pattern of the outgoing light can be controlled. Moreover, both of the reflector 131 and the high heat radiation substrate 132 are made of materials with high thermal conductivities (for example, metals having high thermal conductivities such as aluminum and copper, ceramics having high thermal conductivities such as $Al_2O_3$ and AlN or the like). Thereby, the heat generated by the light-emitting elements 13 can be radiated efficiently in both of an upward direction and a downward direction.

(Embodiment 7)

Figure 14A:
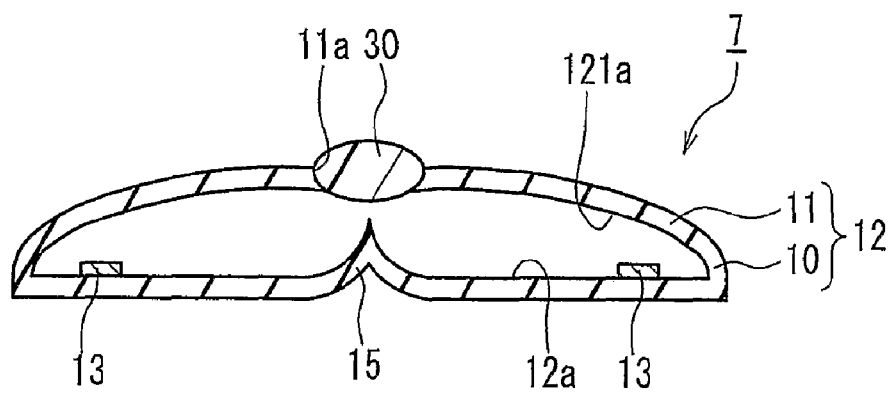
FIG. 14A is a cross-sectional view schematically showing a light-emitting apparatus according to Embodiment 7 of the present invention.
Figure 14B:
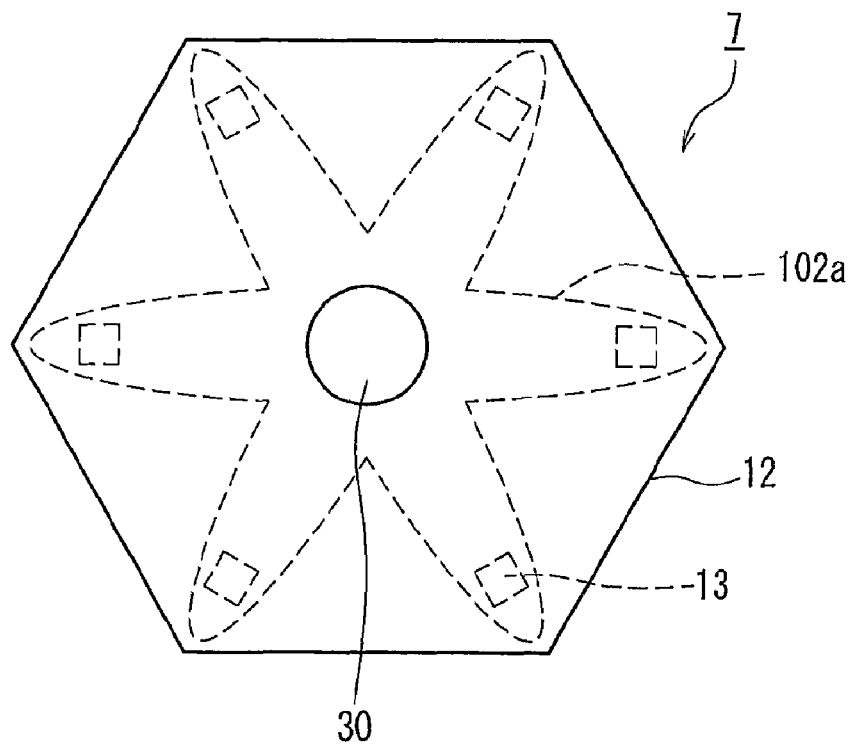
FIG. 14B is a top view schematically showing the light-emitting apparatus that is shown in FIG. 14A.

FIG. 14A is a cross-sectional view schematically showing a light-emitting apparatus according to Embodiment 7 of the present invention, and FIG. 14B is a top view schematically showing the light-emitting apparatus that is shown in FIG. 14A.

As shown in FIG. 14B, the light-emitting apparatus 7 has the six cavities 102a. And, as shown in FIG. 14A, the inner surface 12a (light-reflecting surface) of the base board 10 extends toward the opening 11a so as to have a curved face, and a part constituted of this curved face part serves as the reflecting portion 15. Thereby, a boundary between the light-reflecting surface and the reflecting portion 15 is not present, thereby preventing interference of the reflected light between the light-reflecting surface and the reflecting portion 15. As a result, the uniform reflected light can be obtained, so that the outgoing light from the opening 11a can be uniform. Moreover, the surface of the reflecting portion 15 is a curved face. Thereby, the light distribution of the outgoing light can be controlled by the reflecting portion 15.

Figure 15:
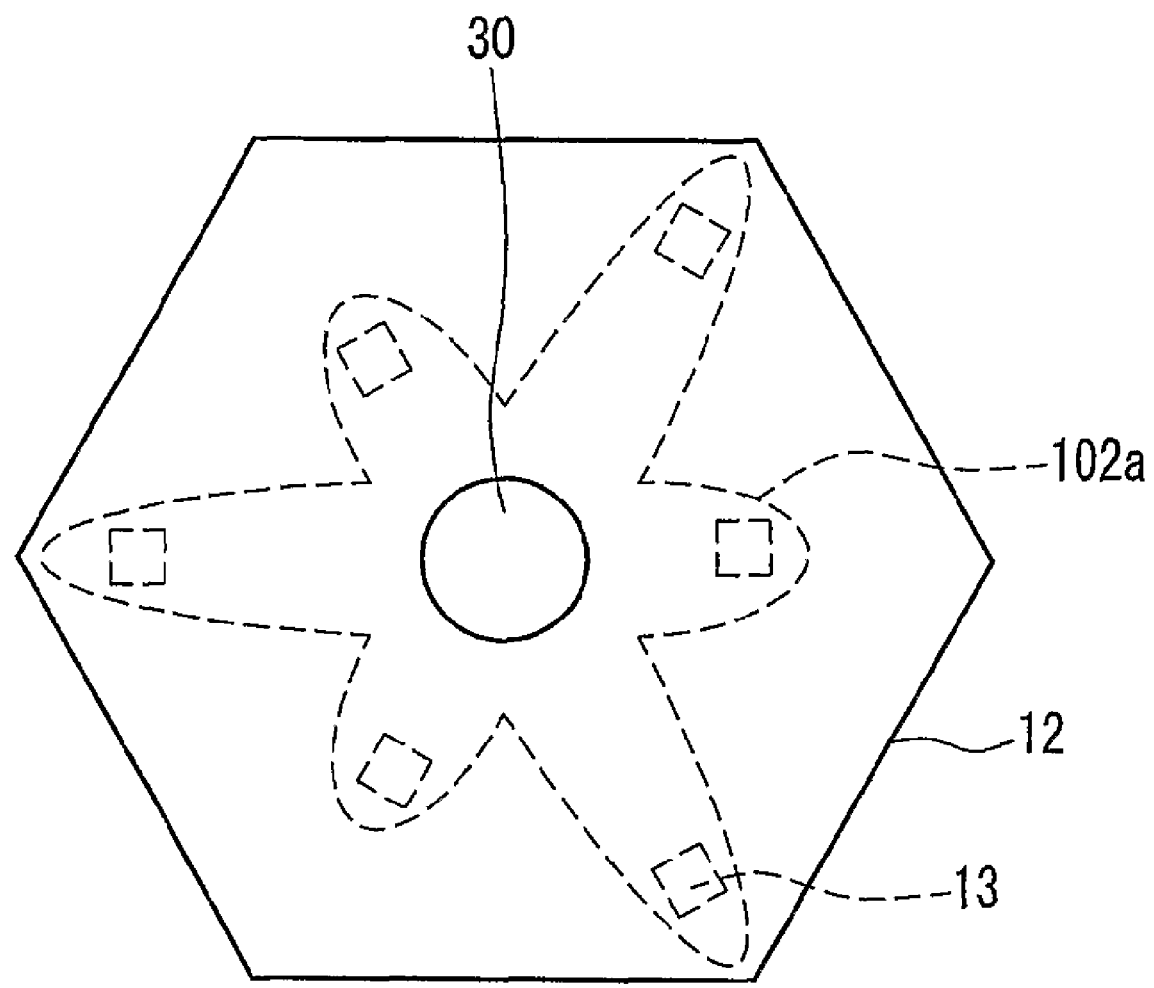
FIG. 15 is a top view schematically showing a modified example of the light-emitting apparatus according to Embodiment 7 of the present invention.

Moreover, in the light-emitting apparatus 7, a cross-sectional shape of the one part 121a of the inner surface 12a (an inner surface of the lid portion 11) is a substantially parabolic shape that spreads out toward the reflecting portion 15. And, the light-emitting elements 13 are disposed at substantial focal positions of the parabola. That is, the one part 121a of the inner surface 12a is constituted of a part of a face that is obtained by rotating the substantial parabola around an axis that connects the two light-emitting elements 13 in FIG. 14A. Thereby, the light taking-out efficiency from the opening 11a is increased similarly to that of the light-emitting apparatus 5 shown in FIG. 5A described above. Incidentally, when the inside of the storage case 12 is structured to be hollow, an inert gas such as Ar and nitrogen, a dry gas or the like may be filled therein, and in the case of sealing the storage case 12, a translucent material may be filled. Moreover, in FIG. 14B, the six cavities 102a are illustrated to have all the same sizes, but are not limited to this, and the sizes of the cavities 102a may be different from one another, as shown in FIG. 15. For example, a cavity that is a relatively large in size is provided with the light-emitting element 13 with a high heat value, and a cavity that is relatively small in size is provided with the light-emitting element 13 with a low heat value, so that the distance between the light-emitting elements 13 that have a large difference in heat value is large, thereby reducing the influence of heat caused by the light-emitting element 13 with the high heat value on the light-emitting element 13 with the low heat value.

(Embodiment 8)

Figure 16A:
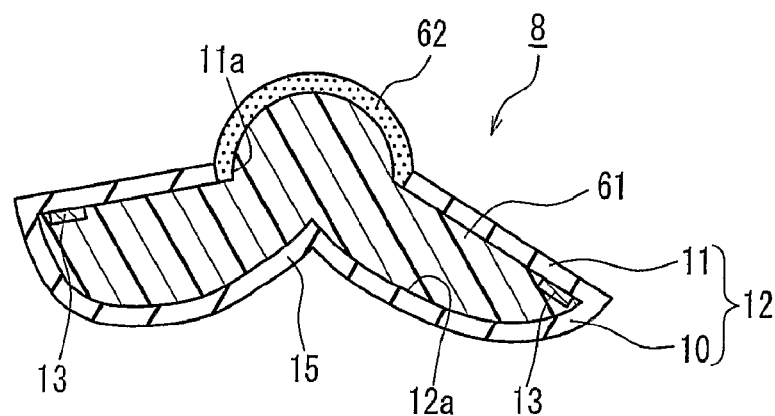
FIG. 16A is a cross-sectional view schematically showing a light-emitting apparatus according to Embodiment 8 of the present invention.
Figure 16B:
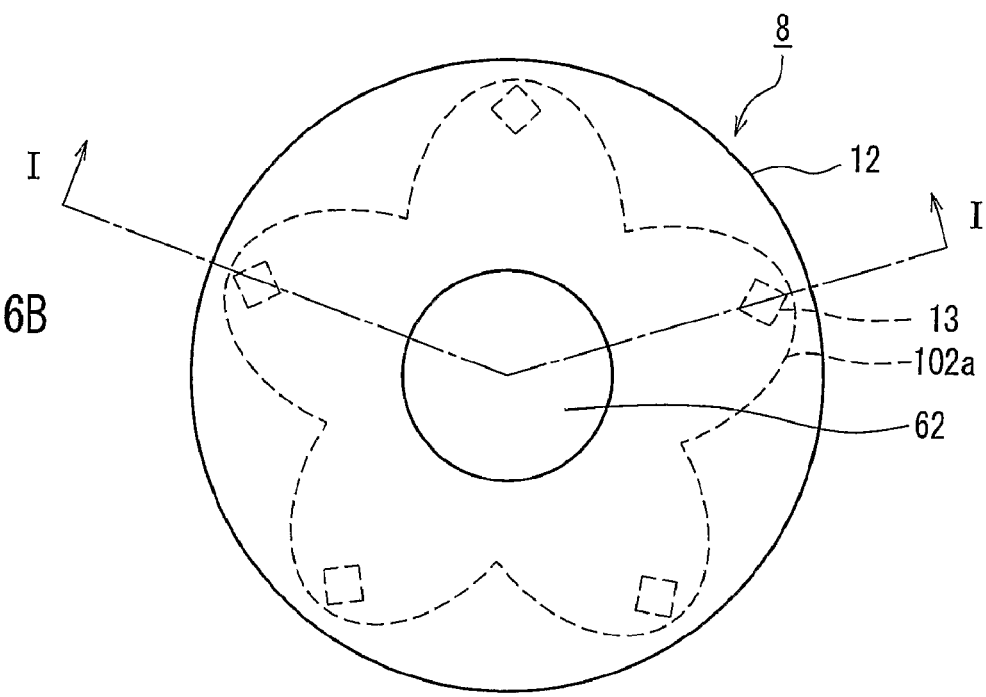
FIG. 16B is a top view schematically showing the light-emitting apparatus that is shown in FIG. 16A.
Figure 16C:
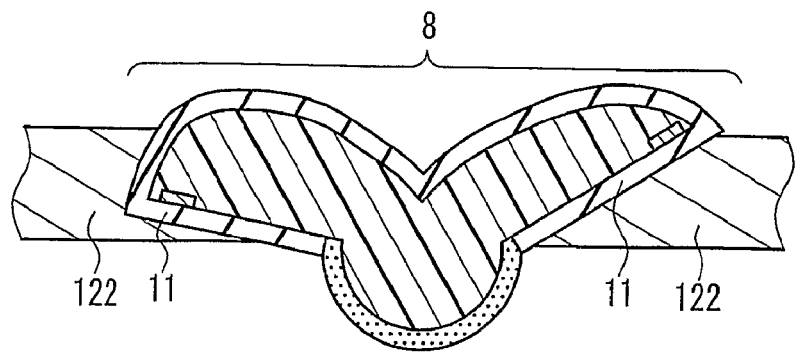
FIG. 16C is a cross-sectional view schematically showing an example in which the light-emitting apparatus that is shown in FIG. 16A is combined with a high heat radiation substrate.

FIG. 16A is a cross-sectional view schematically showing a light-emitting apparatus according to Embodiment 8 of the present invention, FIG. 16B is a top view schematically showing the light-emitting apparatus that is shown in FIG. 16A, and FIG. 16C is a cross-sectional view schematically showing an example in which the light-emitting apparatus that is shown in FIG. 16A is combined with a high heat radiation substrate. Incidentally, FIG. 16A is a schematic cross-sectional view seen from a viewing direction of I-I in FIG. 16B.

As shown in FIG. 16B, the light-emitting apparatus 8 has the five cavities 102a. And, as shown in FIG. 16A, the inner surface 12a (light-reflecting surface) of the base board 10 extends toward the opening 11a so as to have a curved face, and a part constituted of this curved face part serves as the reflecting portion 15. Thereby, a boundary between the light-reflecting surface and the reflecting portion 15 is not present, thereby preventing interference of the reflected light between the light-reflecting surface and the reflecting portion 15. As a result, the uniform reflected light can be obtained, so that the outgoing light from the opening 11a can be uniform. Moreover, the surface of the reflecting portion 15 is a curved face. Thereby, the light distribution of the outgoing light can be controlled by the reflecting portion 15.

Moreover, in the light-emitting apparatus 8, a cross-sectional shape of the inner surface 12a of the base board 10 is a substantially parabolic shape that spreads out toward the reflecting portion 15. And, the light-emitting elements 13 are disposed at substantial focal positions of the parabola. Thereby, the light taking-out efficiency from the opening 11a is increased similarly to that of the light-emitting apparatus 5 shown in FIG. 5A described above.

Moreover, in the light-emitting apparatus 8, an end of each of the cavities 102a on a side of the lid portion 11 (that is, the inner surface of the lid portion 11) is provided with one of the light-emitting elements 13. Moreover, as shown in FIG. 16A, the inner surfaces of the lid portion 11 are inclined toward a side of the base board 10 with respect to the opening 11a (a face of the opening). Thereby, a large part of the light from the light-emitting elements 13 can be taken out from the opening 11a without being reflected multiple times by the inner surfaces 12a, thereby increasing the light taking-out efficiency. Moreover, inclined angles of the inner surface of the lid portion 11 toward the side of the base board 10 are varied according to the respective cavities 102a. As described above, by varying the inclined angles of the inner surfaces of the lid portion 11, the light distribution of the outgoing light can be controlled. It should be noted that the present embodiment has illustrated the example in which the inclined angles are varied, but the inclined angles may be equal to one another similarly to the other embodiments.

Incidentally, in the light-emitting apparatus 8, a material having a high thermal conductivity is used preferably as a material of the lid portion 11 on which the light-emitting elements 13 are mounted. The reason for this is because the material with the high thermal conductivity can radiate the heat generated by the light-emitting elements 13 efficiently. As the above-described material with the high thermal conductivity, for example, metals having high thermal conductivities such as aluminum and copper, ceramics having high thermal conductivities such as $Al_2O_3$ and AlN or the like can be used. In this case, as shown in FIG. 16C, by fixing the light-emitting apparatus 8 to the high heat radiation substrate 122 in a state where the lid portion 11 is in contact with the high heat radiation substrate 122, the heat generated by the light-emitting elements 13 can be radiated more efficiently.

Next, examples of the configuration of the light-emitting elements 13 in the above-described respective embodiments, and examples of the form of mounting the light-emitting elements 13 will be explained with reference to FIGS. 17 and 18. The light-emitting element 13 is constituted of at least a light-emitting layer, a n-type semiconductor layer that is in contact with one side of main surfaces of the light-emitting layer, a p-type semiconductor layer that is in contact with the other side of the main surfaces of the light-emitting layer, a cathode electrode that is connected electrically with the n-type semiconductor layer, and an anode electrode that is connected electrically with the p-type semiconductor layer.

Figure 17A:
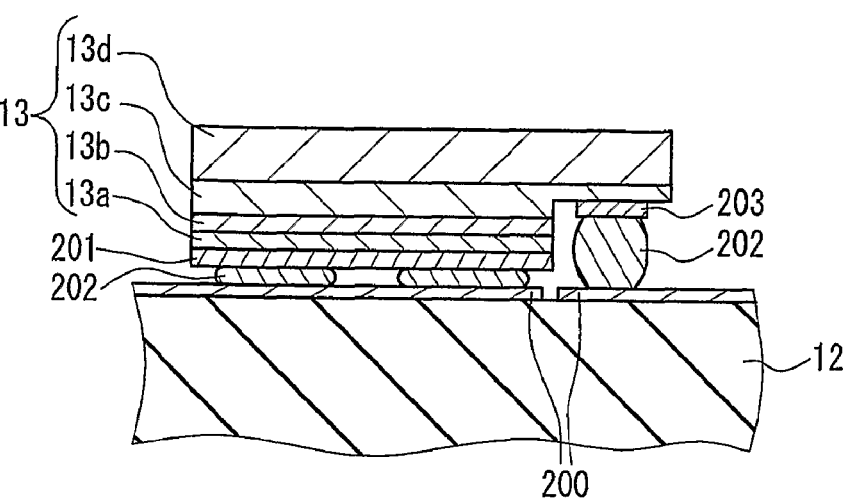
FIGS. 17A to 17C are cross-sectional views showing an example of a configuration of the light-emitting element used in the present invention, and an example of a mounting form thereof.

In the example shown in FIG. 17A, the light-emitting element 13 has a configuration in which a p-GaN layer 13a as the p-type semiconductor layer, a light-emitting layer 13b, a n-GaN layer 13c as the n-type semiconductor layer and a n-GaN substrate 13d are layered in this order from a side of a metal wiring 200 that is formed on the inner surface of the storage case 12. The p-GaN layer 13a is provided with a Rh/Pt/Au electrode 201 that is a high reflective electrode as an anode electrode, and this Rh/Pt/Au electrode 201 is connected with a bump 202. Moreover, a part of the n-GaN layer 13c is provided with a Ni/Au electrode 203 as a cathode electrode, and this Ni/Au electrode 203 also is connected with the bump 202. Thereby, the light-emitting element 13 is flip-chip-mounted on the metal wiring 200 via the bump 202.

Figure 17B:
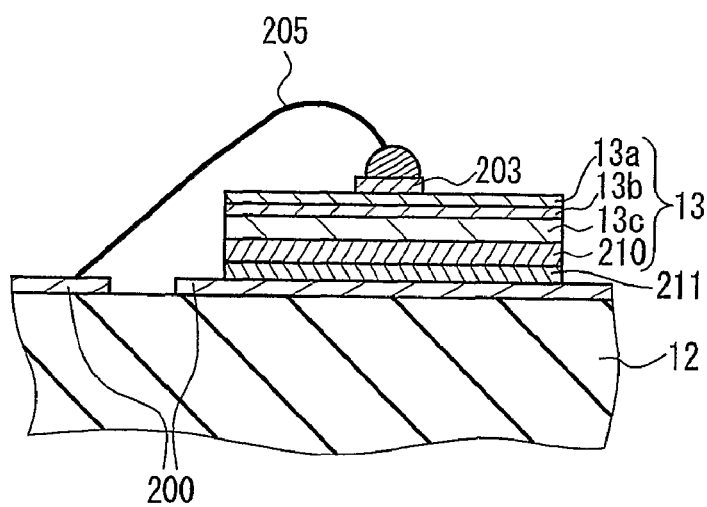

In the example shown in FIG. 17B, the Ni/Au electrode 203 serving as the anode electrode, which is provided on the p-GaN layer 13a as the p-type semiconductor layer, and the metal wiring 200 are wire-bonded by a wire 205. Moreover, in the example shown in FIG. 17B, a n-SiC substrate 210 can be used as the substrate for the light-emitting elements 13, and the n-GaN layer 13c serving as the n-type semiconductor layer that is disposed on the n-SiC substrate 210 is connected electrically with a Ni/Ag/Pt/Au electrode 211 serving as a cathode electrode (high reflective electrode) via the n-SiC substrate 210. The n-SiC substrate 210 is connected electrically with the metal wiring 200 via the Ni/Ag/Pt/Au electrode 211.

Figure 17C:
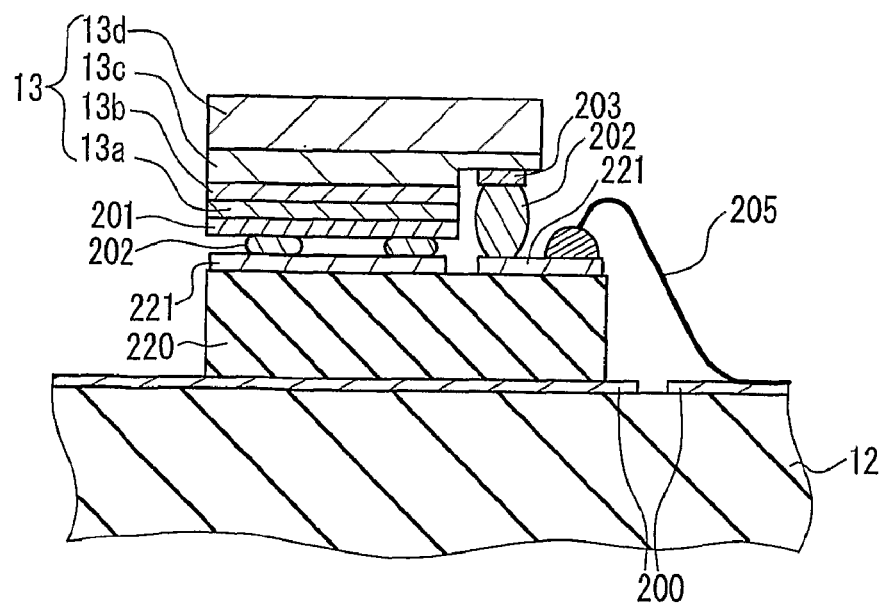

In the example shown in FIG. 17C, the light-emitting elements 13 are flip-chip-mounted on a metal wiring 221 that is formed on a submount substrate 220 made of Si, and the metal wiring 221 is connected electrically with the metal wiring 200 via the wire 205.

Figure 18A:
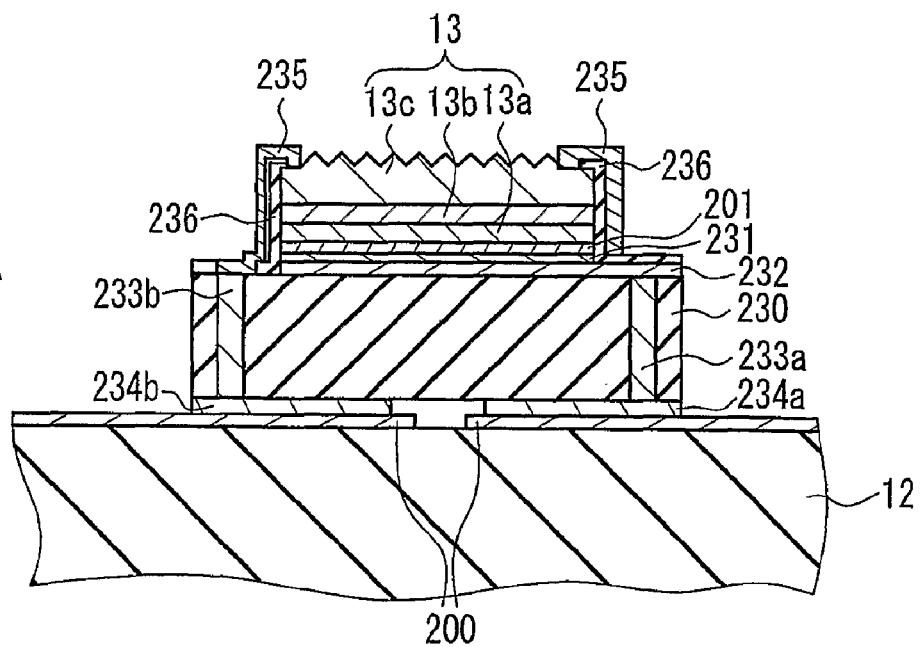
FIGS. 18A and 18B are cross-sectional views showing an example of a configuration of the light-emitting element used in the present invention, and an example of a mounting form thereof.

In the example shown in FIG. 18A, the light-emitting elements 13 are mounted on the submount substrate 230 made of alumina ($Al_2O_3$) by adhering the Rh/Pt/Au electrode 201 serving as the anode electrode by an Au/Sn adhesive layer 231. The Au/Sn adhesive layer 231 is connected electrically with a terminal 234a via a Ti/Pt/Au electrode 232 and a Pt contact pin 233a. Moreover, the n-GaN layer 13c is connected electrically with a terminal 234b via a Ti/Au electrode 235 and a Pt contact pin 233b that serve as the cathode electrode. Further, a surface of the n-GaN layer 13c is processed to have asperities. Thereby, the light taking-out efficiency can be increased. Moreover, between a lateral surface of the light-emitting element 13 and the Ti/Au electrode 235, a silicon nitride film 236 serving as an insulating film is disposed.

Figure 18B:
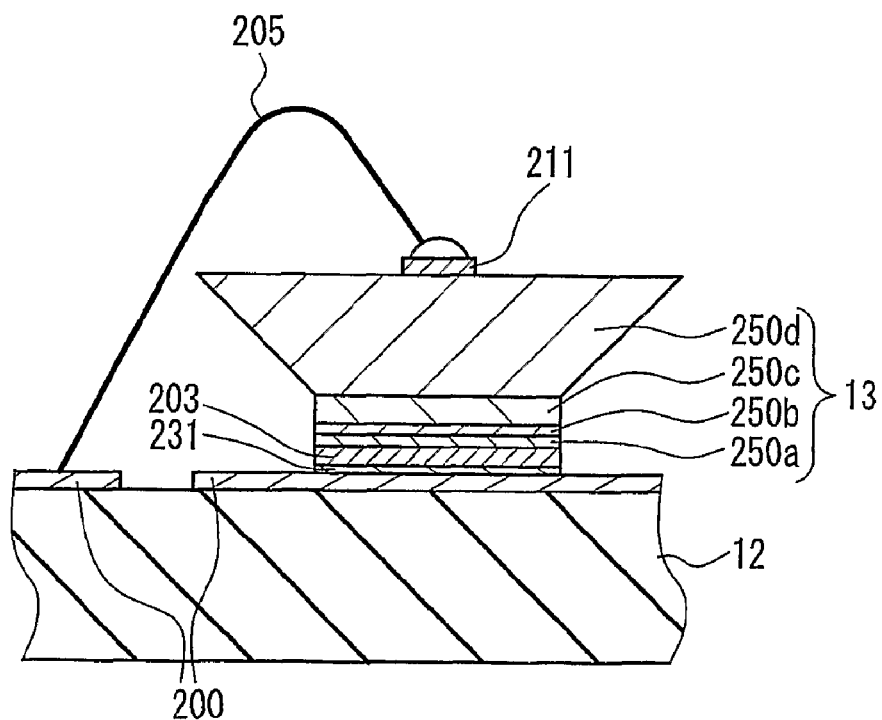

In the example shown in FIG. 18B, the light-emitting element 13 has a configuration in which a p-InGaAlP layer 250a as a p-type semiconductor layer, a light-emitting layer 250b, a n-InGaAlP layer 250c as a n-type semiconductor layer and a n-GaP substrate 250d are layered in this order from a side of the metal wiring 200. This light-emitting element 13 emits red light. Moreover, the p-InGaAlP layer 250a is provided with a Ni/Au electrode 203 serving as an anode electrode, and this Ni/Au electrode 203 is connected electrically with the metal wiring 200 via the Au/Sn adhesive layer 231. Moreover, the n-GaP substrate 250d is provided with the Ni/Ag/Pt/Au electrode 211 serving as the cathode electrode, and this Ni/Ag/Pt/Au electrode 211 is connected electrically with the metal wiring 200 via the wire 205. Incidentally, FIGS. 17A to 17C, 18A and 18B do not illustrate the example where the light-emitting element 13 is provided with the wavelength converting portion directly, but it is possible that, for example, a surrounding of the light-emitting element 13 of FIG. 17A is covered with the wavelength converting portion three-dimensionally and that the wavelength converting portion is layered on the submount substrate 230 of FIG. 18A so as to cover the light-emitting element 13. According to this configuration, the light from the light-emitting elements 13 and the converted light from the wavelength converting portion are scattered and reflected repeatedly inside the storage case 12, so that the light that is mixed uniformly and has no color irregularity outgoes from the opening 11a.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

Industrial Applicability

The light-emitting apparatus of the present invention is applied usefully to, for example, an illumination apparatus that is used for general illumination, stage lighting (spot light, sign light and the like), light for automobile (in particular, front light) and the like, and display apparatuses that are used for displays, projectors and the like. Also, the light-emitting apparatus of the present invention is useful as a light source for a sensor that is required to be decreased in size and thickness.

The invention claimed is:

1. A light-emitting apparatus comprising: a storage case that includes a base board having a concave portion and a lid portion covering the concave portion; and a plurality of light-emitting elements that are disposed on an inner surface of the case,
   wherein an opening is formed in the lid portion,
   a plurality of cavities that are branched from the position directly underneath the opening are formed in the case,
   an inner surface of each of the cavities is a light-reflecting surface and is constituted of a parabolic surface and a flat surface opposing the parabolic surface,
   a focal position of the parabolic surface is positioned on the flat surface,
   respective ones of the plurality of light-emitting elements are disposed at the focal positions of respective ones of the plurality of cavities,
   the light-reflecting surface guides light emitted by the light-emitting elements as light sources to a position directly underneath the opening,
   a reflecting portion is formed directly underneath the opening so as to reflect the light emitted by the light-emitting elements toward the opening,
   a front end portion of the reflecting portion is disposed near the opening, and
   the light-emitting apparatus comprises further a convex lens that closes the opening and a reflector that is disposed on the lid portion of the storage case so as to expose the convex lens.

2. A light-emitting apparatus comprising: a storage case that includes a base board having a concave portion and a lid portion covering the concave portion; and a plurality of light-emitting elements that are disposed on an inner surface of the case,
   wherein an opening is formed in the lid portion,
   a plurality of cavities that are branched from the position directly underneath the opening are formed in the case,
   an inner surface of each of the cavities is a light-reflecting surface and is constituted of a parabolic surface and a flat surface opposing the parabolic surface,
   a focal position of the parabolic surface is positioned on the flat surface,
   respective ones of the plurality of light-emitting elements are disposed at the focal positions of respective ones of the plurality of cavities,
   the light-reflecting surface guides light emitted by the light-emitting elements as light sources to a position directly underneath the opening,
   a reflecting portion is formed directly underneath the opening so as to reflect the light emitted by the light-emitting elements toward the opening,
   a front end portion of the reflecting portion is disposed near the opening, and
   the light-emitting apparatus comprises further a convex lens that closes the opening and a flat lens that is disposed on the lid portion of the storage case so as to cover the convex lens.

3. A light-emitting apparatus comprising: a storage case that includes a base board having a concave portion and a lid portion covering the concave portion; and a plurality of light-emitting elements that are disposed on an inner surface of the case,
   wherein an opening is formed in the lid portion,
   a plurality of cavities that are branched from the position directly underneath the opening are formed in the case,
   an inner surface of each of the cavities is a light-reflecting surface and is constituted of a parabolic surface and a flat surface opposing the parabolic surface,
   a focal position of the parabolic surface is positioned on the flat surface,
   respective ones of the plurality of light-emitting elements are disposed at the focal positions of respective ones of the plurality of cavities,
   the light-reflecting surface guides light emitted by the light-emitting elements as light sources to a position directly underneath the opening,
   a reflecting portion is formed directly underneath the opening so as to reflect the light emitted by the light-emitting elements toward the opening,
   a front end portion of the reflecting portion is disposed near the opening,
   the light-emitting apparatus comprises further a convex lens that closes the opening and a lens that is disposed on the lid portion of the storage case so as to cover the convex lens, and
   the lens spreads out from the convex lens as a center so as to have a parabolic shape.

4. A light-emitting apparatus comprising: a storage case that includes a base board having a concave portion and a lid portion covering the concave portion; and a plurality of light-emitting elements that are disposed on an inner surface of the case,
   wherein an opening is formed in the lid portion,
   a plurality of cavities that are branched from the position directly underneath the opening are formed in the case,
   an inner surface of each of the cavities is a light-reflecting surface and is constituted of a parabolic surface and a flat surface opposing the parabolic surface,
   a focal position of the parabolic surface is positioned on the flat surface,
   respective ones of the plurality of light-emitting elements are disposed at the focal positions of respective ones of the plurality of cavities,
   the light-reflecting surface guides light emitted by the light-emitting elements as light sources to a position directly underneath the opening,
   a reflecting portion is formed directly underneath the opening so as to reflect the light emitted by the light-emitting elements toward the opening,
   a front end portion of the reflecting portion is disposed near the opening,
   the light-emitting apparatus comprises further a convex lens that closes the opening and a lens that is disposed on the lid portion of the storage case so as to cover the convex lens, and
   the lens has an asymmetrical shape with respect to a vertex of the convex lens.

5. A light-emitting apparatus comprising: a storage case that includes a base board having a concave portion and a lid portion covering the concave portion; and a plurality of light-emitting elements that are disposed on an inner surface of the case,
   wherein an opening is formed in the lid portion,
   a plurality of cavities that are branched from the position directly underneath the opening are formed in the case,
   an inner surface of each of the cavities is a light-reflecting surface and is constituted of a parabolic surface and a flat surface opposing the parabolic surface,
   a focal position of the parabolic surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, a front end portion of the reflecting portion is disposed near the opening, and the light-emitting apparatus comprises further a window portion that closes the opening and a high heat radiation substrate that is disposed on the lid portion of the storage case so as to expose the window portion.

6. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of a parabolic surface and a flat surface opposing the parabolic surface, a focal position of the parabolic surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, a front end portion of the reflecting portion is disposed near the opening, materials having different refractive indices are filled in the storage case, a high refractive index material included in the materials and having a refractive index that is higher than a refractive index of other region in the storage case is disposed directly underneath the opening in the storage case, a part of the high refractive index material protrudes from the opening so as to have a substantially hemisphere shape, and the light-emitting apparatus comprises further a wavelength converting portion having a dome shape and formed outside the storage case so as to cover the part of the high refractive index material protruding to have a substantially hemisphere shape, a reflector that is disposed on the lid portion of the storage case so as to expose the wavelength converting portion, and a high heat radiation substrate that is disposed on a bottom surface of the storage case.

7. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, and the light-emitting apparatus comprises further a convex lens that closes the opening and a reflector that is disposed on the lid portion of the storage case so as to expose the convex lens.

8. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, and the light-emitting apparatus comprises further a convex lens that closes the opening and a flat lens that is disposed on the lid portion of the storage case so as to cover the convex lens.

9. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, the light-emitting apparatus comprises further a convex lens that closes the opening and a lens that is disposed on the lid portion of the storage case so as to cover the convex lens, and the lens spreads out from the convex lens as a center so as to have a parabolic shape.

10. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, the light-emitting apparatus comprises further a convex lens that closes the opening and a lens that is disposed on the lid portion of the storage case so as to cover the convex lens, and the lens has an asymmetrical shape with respect to a vertex of the convex lens.

11. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, and the light-emitting apparatus comprises further a window portion that closes the opening and a high heat radiation substrate that is disposed on the lid portion of the storage case so as to expose the window portion.

12. A light-emitting apparatus comprising: a storage case that includes a base board having a concave portion and a lid portion covering the concave portion; and a plurality of light-emitting elements that are disposed on an inner surface of the case, wherein an opening is formed in the lid portion, a plurality of cavities that are branched from the position directly underneath the opening are formed in the case, an inner surface of each of the cavities is a light-reflecting surface and is constituted of an ellipse surface and a flat surface opposing the ellipse surface, a focal position of the ellipse surface is positioned on the flat surface, respective ones of the plurality of light-emitting elements are disposed at the focal positions of respective ones of the plurality of cavities, the light-reflecting surface guides light emitted by the light-emitting elements as light sources to a position directly underneath the opening, a reflecting portion is formed directly underneath the opening so as to reflect the light emitted by the light-emitting elements toward the opening, materials having different refractive indices are filled in the storage case, a high refractive index material included in the materials and having a refractive index that is higher than a refractive index of other region in the storage case is disposed directly underneath the opening in the storage case, a part of the high refractive index material protrudes from the opening so as to have a substantially hemisphere shape, and the light-emitting apparatus comprises further a wavelength converting portion having a dome shape and formed outside the storage case so as to cover the part of the high refractive index material protruding to have a substantially hemisphere shape, a reflector that is disposed on the lid portion of the storage case so as to expose the wavelength converting portion, and a high heat radiation substrate that is disposed on a bottom surface of the storage case.

* * * * *